United States Patent
Nakagomi et al.

(10) Patent No.: US 12,216,171 B2
(45) Date of Patent: Feb. 4, 2025

(54) ESTIMATION METHOD, ESTIMATION SYSTEM, AND NON-TRANSITORY COMPUTER-READABLE RECORDING MEDIUM

(71) Applicant: Yokogawa Electric Corporation, Tokyo (JP)

(72) Inventors: Masaru Nakagomi, Tokyo (JP); Satoshi Yoshitake, Tokyo (JP); Masahiro Kazumi, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 127 days.

(21) Appl. No.: 18/070,955

(22) Filed: Nov. 29, 2022

(65) Prior Publication Data
US 2023/0168309 A1    Jun. 1, 2023

(30) Foreign Application Priority Data
Dec. 1, 2021 (JP) .................. 2021-195710

(51) Int. Cl.
G01R 31/389    (2019.01)
G01R 31/3842   (2019.01)
H02J 7/00      (2006.01)

(52) U.S. Cl.
CPC ....... *G01R 31/389* (2019.01); *G01R 31/3842* (2019.01); *H02J 7/0047* (2013.01)

(58) Field of Classification Search
None
See application file for complete search history.

(56) References Cited

U.S. PATENT DOCUMENTS

| 2016/0195589 A1 | 7/2016 | Hanyu et al. |
| 2021/0311129 A1 | 10/2021 | Yezerets et al. |
| 2023/0079401 A1* | 3/2023 | Nakamura ............ H01M 4/505 429/7 |

FOREIGN PATENT DOCUMENTS

| CN | 111948546 A | 11/2020 |
| JP | 2013019709 A | 1/2013 |

(Continued)

OTHER PUBLICATIONS

Li Yi et al: "A quick on-line state of health estimation method for Li-ion battery with incremental capacity curves processed by Gaussian filter", Journal of Power Sources, vol. 373, Jan. 1, 2018 (Jan. 1, 2018), pp. 40-53, XP085291353, ISSN: 0378-7753, DOI: 10.1016/J.JPOWSOUR.2017.10.092 (8 pages).

(Continued)

*Primary Examiner* — Jas A Sanghera
(74) *Attorney, Agent, or Firm* — Osha Bergman Watanabe & Burton LLP

(57) ABSTRACT

An estimation method includes: performing, for each different degree of degradation, regression analysis between a first value and a second value, wherein the first value is related to one or more reference feature points on a differential curve of a charging-discharging curve indicating a voltage value with respect to integrated current amount of a reference storage battery, and the second value is at least one of a capacity value of the reference storage battery and an internal resistance value of the reference storage battery; and estimating at least one of a capacity value of a target storage battery and an internal resistance value of the target storage battery, based on a result of the regression analysis and a third value related to one or more target feature points on a differential curve of a charging-discharging curve of the target storage battery.

10 Claims, 16 Drawing Sheets

(56) References Cited

FOREIGN PATENT DOCUMENTS

| JP | 2015060761 A | 3/2015 |
|---|---|---|
| JP | 2018205138 A | 12/2018 |
| JP | 6485041 B2 | 3/2019 |
| JP | 2019096552 A | 6/2019 |
| JP | 2019158597 A | 9/2019 |
| WO | 2021/186537 A1 | 9/2021 |

OTHER PUBLICATIONS

Weng Caihao et al: "State-of-health monitoring of lithium-ion battery modules and packs via incremental capacity peak tracking", Applied Energy, Elsevier Science Publishers, GB, vol. 180, Aug. 4, 2016 (Aug. 4, 2016), pp. 360-368, XP029709869, ISSN: 0306-2619, DOI: 10.1016/J.APENERGY.2016.07.126 (6 pages).

Weng Caihao et al: "on-board state of health monitoring of lithium-ion batteries using incremental capacity analysis with support vector regression", Journal of Power Sources, Elsevier, Amsterdam, NL, vol. 235, Feb. 11, 2013 (Feb. 11, 2013), pp. 36-44, XP028580894, ISSN: 0378-7753, DOI: 10.1016/J.JPOWSOUR.2013.02.012 (6 pages).

Extended European Search Report issued in corresponding European Patent Application No. 22209818.8 dated Apr. 25, 2023 (78 pages).

Notice of Reasons for Refusal issued in corresponding Japanese Patent Application No. 2021-195710, dated Oct. 17, 2023, (8 pages).

\* cited by examiner

DIFFERENTIAL CURVE

DETECTION OF PEAK P

FIG.6

DATA OF EACH PEAK P

PEAK P-1

| CAPACITY VALUE [Ah] | VOLTAGE VALUE VP-1 [V] | DERIVATIVE VALUE DP-1 [Ah/V] | RESISTANCE VALUE RATIO | VOLTAGE VALUE VP-1 [V] | RESISTANCE VALUE RATIO | DERIVATIVE VALUE DP-1 [Ah/V] |
|---|---|---|---|---|---|---|
| 3.26 | 3.468 | 3.863 | 1.00 | 3.468 | 1.00 | 3.863 |
| 3.15 | 3.482 | 3.642 | 1.17 | 3.482 | 1.17 | 3.642 |
| 2.90 | 3.505 | 3.134 | 1.39 | 3.505 | 1.39 | 3.134 |
| 2.59 | 3.552 | 2.671 | 2.22 | 3.552 | 2.22 | 2.671 |
| ... | ... | ... | ... | ... | ... | ... |

FIG.12

RESULT OF REGRESSION ANALYSIS

| PEAK P | CO-EFFICIENT $k_A$ ET CETERA | CORRELATION CO-EFFICIENT | CO-EFFICIENT $k_B$ ET CETERA | CORRELATION CO-EFFICIENT | CO-EFFICIENT $k_C$ ET CETERA | CORRELATION CO-EFFICIENT | CO-EFFICIENT $k_D$ ET CETERA | CORRELATION CO-EFFICIENT |
|---|---|---|---|---|---|---|---|---|
| PEAK P-1 | xxx | xxx | xxx | xxx | xxx | xxx | xxx | xxx |
| PEAK P-2 | xxx | xxx | xxx | xxx | xxx | xxx | xxx | xxx |
| PEAK P-3 | xxx | xxx | xxx | xxx | xxx | xxx | xxx | xxx |
| ⋮ | ⋮ | ⋮ | ⋮ | ⋮ | ⋮ | ⋮ | ⋮ | ⋮ |

FIG.13

COEFFICIENT DATA 92

| | |
|---|---|
| DATA FOR CAPACITY VALUE ESTIMATION | PEAK P-2 |
| | COEFFICIENT $k_A$ ET CETERA=xxx |
| | CHARGING-DISCHARGING CURRENT VALUE=xxx |
| | ... |
| DATA FOR INTERNAL RESISTANCE VALUE ESTIMATION | PEAK P-2 |
| | COEFFICIENT $k_A$ ET CETERA=xxx |
| | INITIAL INTENRAL RESISTANCE VALUE=xxx |
| | CHARGING-DISCHARGING CURRENT VALUE=xxx |
| | ... |

DIFFERENTIAL CURVE

DETECTION OF PEAK P

ESTIMATION METHOD, ESTIMATION SYSTEM, AND NON-TRANSITORY COMPUTER-READABLE RECORDING MEDIUM

CROSS-REFERENCE TO RELATED APPLICATIONS

The present application claims priority to Japanese Patent Application No. 2021-195710 filed in Japan on Dec. 1, 2021. The contents of this application are incorporated herein by reference in their entirety.

BACKGROUND

Technical Field

The present invention relates to an estimation method, an estimation system, and a non-transitory computer-readable recording medium.

Description of the Related Art

A technology is known in which the degradation occurring in a storage battery is estimated based on the differential curve of the charging-discharging curve of the storage battery (for example, refer to Japanese Patent No. 6485041).

If the capacity value and the internal resistance value of a degraded storage battery can be estimated, it comes in very useful. However, as far as a specific estimation method is concerned, there is still room to study. Besides, only a limited volume of data can be obtained from a storage battery in use.

SUMMARY

One or more embodiments provide an improvement over conventional technologies by enabling estimation of the capacity value and the internal resistance value even when only a limited volume of data is available.

According to one or more embodiments, an estimation method includes: performing, for each different degree of degradation, regression analysis between value of a feature point appearing on differential curve of a charging-discharging curve, which indicates voltage value with respect to integrated current amount of a reference storage battery, and at least either capacity value or internal resistance value of the reference storage battery; and estimating, based on result of the regression analysis and based on value related to a feature point appearing on differential curve of target storage battery for estimation, at least either capacity value or internal resistance value of the target storage battery for estimation.

According to one or more embodiments, an estimation system includes: a regression analysis unit (a processor) that performs, for each different degree of degradation, regression analysis between value of a feature point appearing on differential curve of a charging-discharging curve, which indicates voltage value with respect to integrated current amount of a reference storage battery, and at least either capacity value or internal resistance value of the reference storage battery; and an estimating unit (the processor) that, based on result of the regression analysis and based on value related to a feature point appearing on differential curve of target storage battery for estimation, estimates at least either capacity value or internal resistance value of the target storage battery for estimation.

According to one or more embodiments, a non-transitory computer-readable recording medium stores therein estimation instructions that cause a computer to perform: performing, for each different degree of degradation, regression analysis between value of a feature point appearing on differential curve of a charging-discharging curve, which indicates voltage value with respect to integrated current amount of a reference storage battery, and at least either capacity value or internal resistance value of the reference storage battery; and estimating, based on result of the regression analysis and based on value related to a feature point appearing on differential curve of target storage battery for estimation, at least either capacity value or internal resistance value of the target storage battery for estimation.

BRIEF DESCRIPTION OF THE DRAWINGS

FIG. 6 is a diagram illustrating an example of the data corresponding to each peak;

FIG. 12 is a diagram illustrating an example of the result of regression analysis;

FIG. 13 is a diagram illustrating an example of coefficient data;

DETAILED DESCRIPTION

Figure 1:
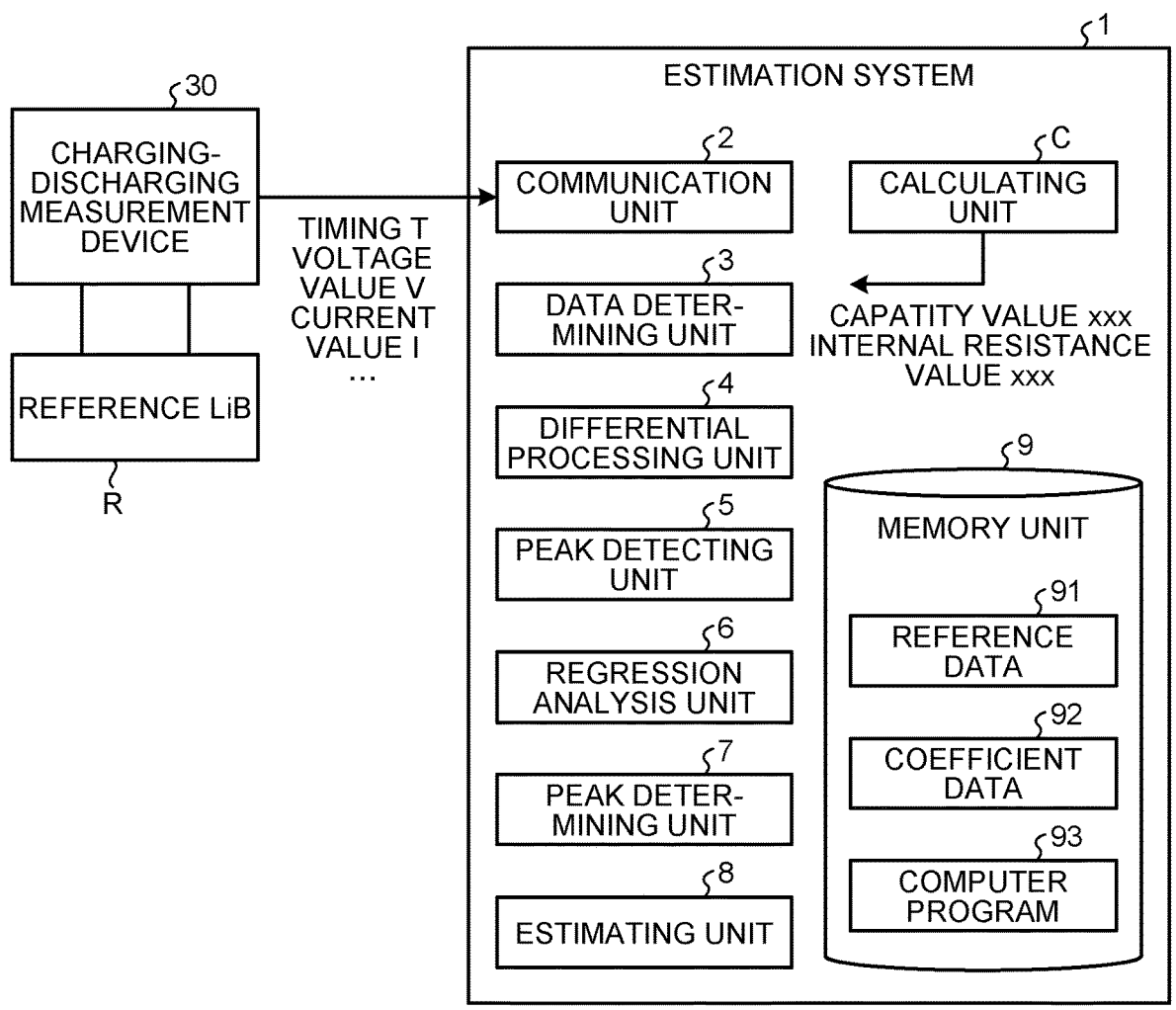
FIG. 1 is a diagram illustrating an exemplary overall configuration of an estimation system according to one or more embodiments in a preparatory stage.

Exemplary embodiments are described below with reference to the accompanying drawings. Herein, identical constituent elements are referred to by the same reference numerals, and the same explanation about those constituent elements is not repeatedly given.

INTRODUCTION

In a battery energy storage system, a storage battery such as a lithium-ion battery (hereinafter a storage battery will be referred to as "LiB") is installed and used. As the battery energy storage system is put in use, the LiB goes on degradation. Because of such degradation, the capacity value of the LiB goes on decreasing and the internal resistance value of the LiB goes on increasing. The capacity value and the internal resistance value are important parameters as far as the operation of the battery energy storage system is concerned. With reference to the capacity value, conventionally, a LiB is fully charged from the complete discharge state, and the integrated amount of the electric current at that time is obtained as the capacity value of the LiB. Alternatively, based on the data generated by causing degradation in a LiB, the capacity value of the LiB is obtained from the operation history according to a statistical method.

However, in the case of fully charging a LiB from the complete discharge state, the operation of the battery energy storage system needs to be stopped. That results in an opportunity loss. On the other hand, in a statistical method too, not only the capacity value does not necessarily decrease as per the obtained data, but there is also no way to verify whether or not the obtained capacity value is correct.

At least some of the issues mentioned above are addressed in the technology disclosed herein. Although the detailed explanation is given later, for each degree of degradation, that is, for each different capacity value or each different internal resistance value, the data about the timing, the voltage value, and the current value of a reference LiB is obtained. Then, regression analysis is performed between the feature points, which appear on the differential curve of the charging-discharging curve obtained from the data, and either the capacity value or the internal resistance value. Then, based on the feature points obtained from the data at the time of charging or discharging the target LiB for estimation and based on the result of the regression analysis performed in advance, the capacity value or the internal resistance value of that LiB is estimated. Hence, for example, without having to stop the operation of the battery energy storage system, the capacity value or the internal resistance value of the LiB can be estimated based on the data obtained from the battery energy storage system in operation.

EXAMPLE

Preparatory Stage

Explained below with reference to FIGS. 1 to 14 is an example of the preparation (manufacturing method) regarding an estimation system 1 that is capable of implementing an estimation method according to one or more embodiments. Herein, one of the objectives is to generate coefficient data 92 (explained later).

FIG. 1 is a diagram illustrating an exemplary overall configuration of the estimation system 1 in the preparatory stage. The estimation system 1 estimates at least either the capacity value or the internal resistance value of a LiB. Herein, unless specified otherwise, a LiB is assumed to imply the smallest unit of the configuration that can be treated as a LiB. Such a LiB is also called a battery cell. The value of the voltage and the value of the electric current of a LiB are referred to as a voltage value V and a current value I, respectively. For example, a positive voltage value I corresponds to the discharge current value, and a negative current value I corresponds to a charge current value.

In the example illustrated in FIG. 1, a reference LiB R is connected to a charging-discharging measurement device 30. Firstly, the explanation is given about the charging-discharging measurement device 30, and that is followed by the explanation about the estimation system 1.

The charging-discharging measurement device 30 charges and discharges the reference LiB R. For example, the charging-discharging measurement device 30 is capable of performing constant-current charging and constant-current discharging. At the time of charging the reference LiB R and at the time of discharging the reference LiB R, the charging-discharging measurement device 30 measures the voltage value V and the current value I of the reference LiB R at, for example, regular intervals. Herein, the measurement timing is referred to as a timing T. Then, the charging-discharging measurement device 30 outputs data that contains the timing T, the voltage value V, and the current value I. Moreover, the SOC of the reference LiB R can also be included in the output data.

The abovementioned measurement performed by the charging-discharging measurement device 30 is performed for each of a plurality of degrees of degradation indicating different extents of degradation of the reference LiB R. Thus, for each different degree of degradation, the capacity value and the internal resistance value of the reference LiB R are different.

The estimation system 1 includes a communication unit 2, a calculating unit C, a data determining unit 3, a differential processing unit 4, a peak detecting unit 5, a regression analysis unit 6, a peak determining unit 7, an estimating unit 8, and a memory unit 9. Examples of the information stored in the memory unit 9 include reference data 91, the coefficient data 92, and a computer program 93. Regarding the reference data 91 and the coefficient data 92, the explanation is given later. The computer program 93 is a computer program (software) meant for making a computer perform the operations of the estimation system 1.

The estimation system 1 can be configured using a single device (an estimation device) or can be configured using a plurality of devices. Such a device can be a device available via a network (for example, can be a cloud server device).

The communication unit 2 performs communication with the outside of the estimation system 1. In this example, the communication unit 2 communicates with the charging-discharging measurement device 30 and obtains (receives) the data from the charging-discharging measurement device 30, that is, obtains (receives) the timing T, the voltage value V, and the current value I corresponding to the time of charging or discharging the reference LiB R. The obtained data is stored as the reference data 91 in the memory unit 9.

The calculating unit C calculates the capacity value of the reference LiB R. For example, the charging-discharging measurement device 30 charges the reference LiB R from the lower limit value to the upper limit value of the available voltage range, and the calculating unit C obtains the current values I during the charging via the communication unit 2. Then, the calculating unit C calculates, as the capacity value of the reference LiB R, a integrated current amount (Ah) by integrating the current values I obtained during the charging. Herein, the integration is time-based integration, and the integration time is obtained from the interval between the timings T. Meanwhile, the capacity value can be calculated also by performing discharging instead of performing charging.

The calculating unit C calculates the internal resistance value of the reference LiB R. For example, the calculating unit C calculates the internal resistance value of the reference LiB R according to the current values I obtained during the charging or discharging of the reference LiB R and according to the difference between the open voltage value corresponding to the SOC of the reference LiB R and the voltage value V of the reference LiB R. Herein, the internal resistance value can be the internal resistance value within the decided SOC. Even when the internal resistance value changes according to the SOC, any impact thereof can still be avoided.

In the calculation of the capacity value or the internal resistance value, various known methods other than the method explained above can also be used. Regarding the reference LiB R, the capacity value and the internal resistance value calculated by the calculating unit C are illustrated as "capacity value xxx" and "internal resistance value xxx", respectively. Herein, xxx schematically represents an arbitrary numerical value. The capacity value and the internal resistance value are also stored as the reference data 91 in the memory unit 9.

Meanwhile, alternatively, the capacity value of the reference LiB R can be calculated by the charging-discharging measurement device 30. In that case, the capacity value is calculated and output by the charging-discharging measurement device 30. Thus, the data received by the communication unit 2 from the charging-discharging measurement device 30 contains the capacity value. In that case, the calculating unit C need not calculate the capacity value.

Figure 2:
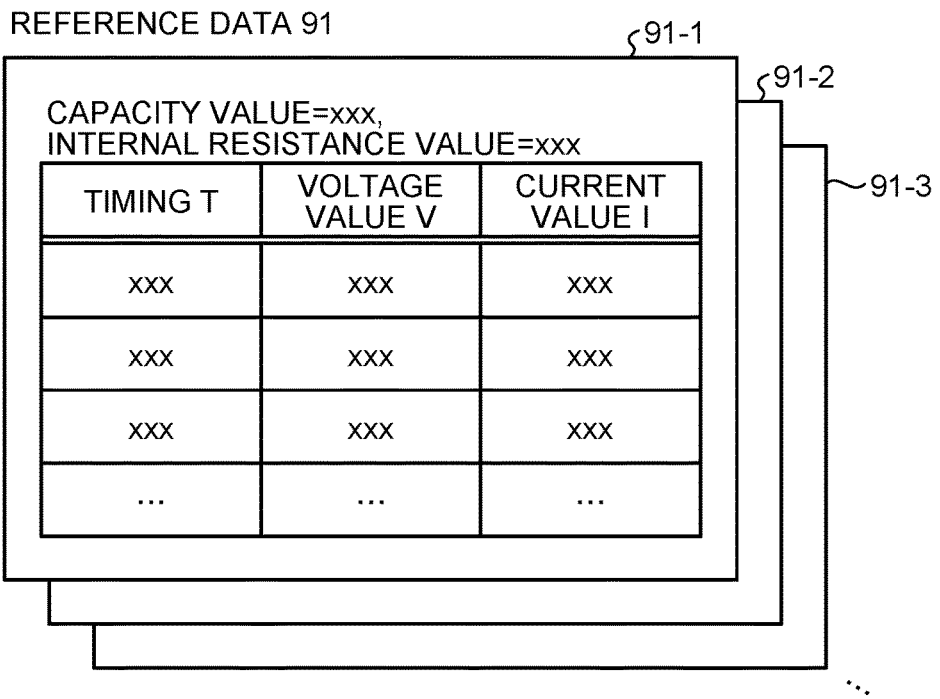
FIG. 2 is a diagram illustrating an example of reference data.

FIG. 2 is a diagram illustrating an example of the reference data 91. In the reference data 91, regarding each capacity value or each internal resistance value (i.e., regarding each degree of degradation) of the reference LiB R; the timing T, the voltage value V, and the current value I are held in a corresponding manner. The sets of reference data 91 corresponding to different degrees of degradation are referred to and illustrated as reference data 91-1, reference data 91-2, reference data 91-3, and so on.

Returning to the explanation with reference to FIG. 1, the determination performed by the data determining unit 3 is an operation not performed in the preparatory stage but performed in an estimation stage (explained later).

The differential processing unit 4 generates a differential curve of the charging-discharging curve for each different degree of degradation (i.e., for each set of the reference data 91). The charging-discharging curve is also referred to as the Q-V curve or the Q-V characteristic, and indicates an integrated current amount Q (Ah) with respect to the voltage value V. The integrated current amount Q is an integrated value obtained by the differential processing unit 4 by integrating the current values I. Meanwhile, alternatively, the charging-discharging curve can indicate only either the charging curve or the discharging curve.

Figure 3:
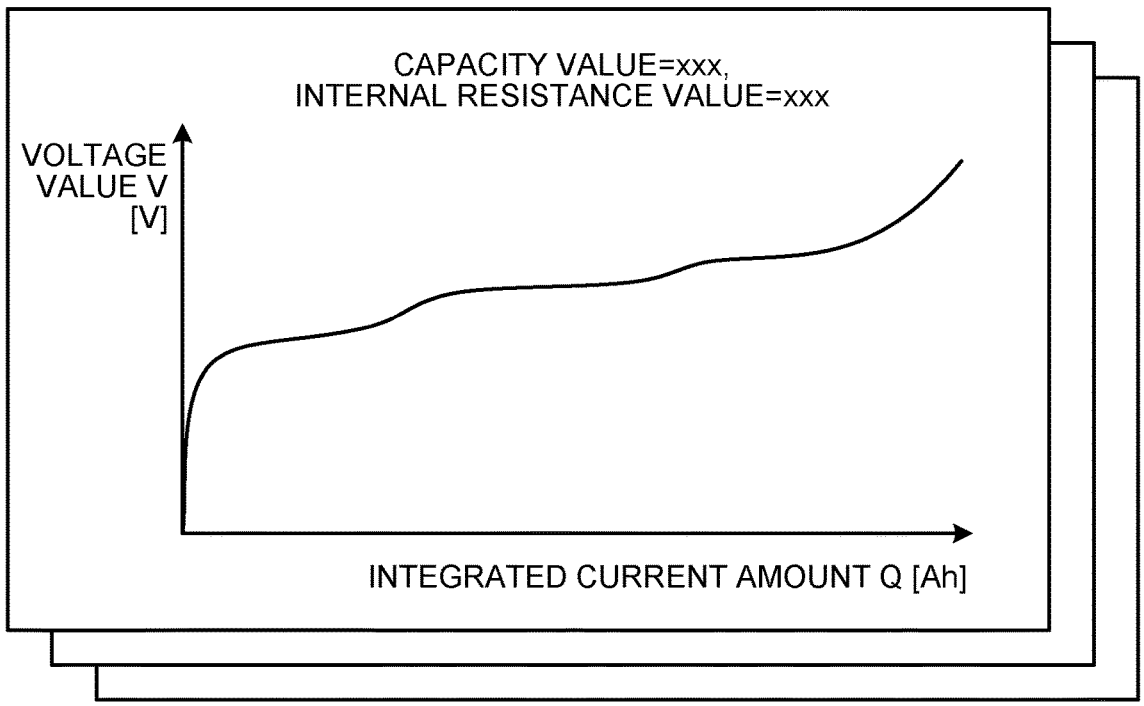
FIG. 3 is a diagram illustrating an example of a charging-discharging curve corresponding to FIG. 2.

FIG. 3 is a diagram illustrating an example of the charging-discharging curve corresponding to FIG. 2. Herein, the horizontal axis of the graph represents the integrated current amount Q (Ah), and the vertical axis represents the voltage value V (V). For each different capacity value or each different internal resistance value, a charging-discharging curve can be obtained in the same manner as illustrated in FIG. 3.

Returning to the explanation with reference to FIG. 1, the differential processing unit 4 generates a differential curve by differentiating the charging-discharging curve. For example, the differential processing unit 4 calculates a derivative value dQ/dV (Ah/V) by differentiating the integrated current amount Q by the voltage value V. In that case, the differential curve represents the derivative value dQ/dV with respect to the voltage value V.

Figure 4:
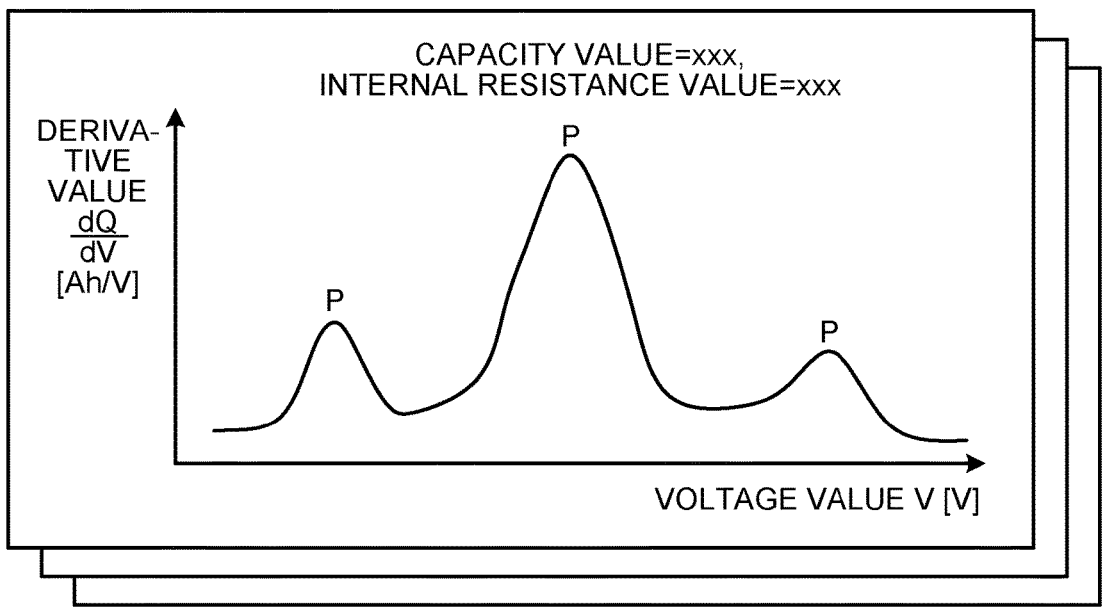
FIG. 4 is a diagram illustrating an example of a differential curve corresponding to FIG. 3.

FIG. 4 is a diagram illustrating an example of the differential curve corresponding to FIG. 3. The horizontal axis represents the voltage value (V), and the vertical axis represents the derivative value dQ/dV (Ah/V). In a corresponding manner to the charging-discharging curve explained earlier with reference to FIG. 3, for each different capacity value or each different internal resistance value, the differential curve is generated as illustrated in FIG. 4.

In a differential curve, one or more feature points appear. As an example of a feature point, such a position (point) in the differential curve can be cited at which the derivative value dQ/dV becomes the maximum. Such a point is referred to and illustrated as a peak P. In the following explanation, within the scope having no contradiction, a peak P can be referred to as a feature point. The peak P can also be interpreted to include the local maximum. In the example illustrated in FIG. 4, in a single differential curve, a plurality of peaks P appears.

Returning to the explanation with reference to FIG. 1, the peak detecting unit 5 detects one or more peaks P appearing in a differential curve. Moreover, the peak detecting unit 5 detects the values related to each peak P. More particularly, the peak detecting unit 5 detects the voltage value V and the derivative value dQ/dV at each peak P.

Figure 5:
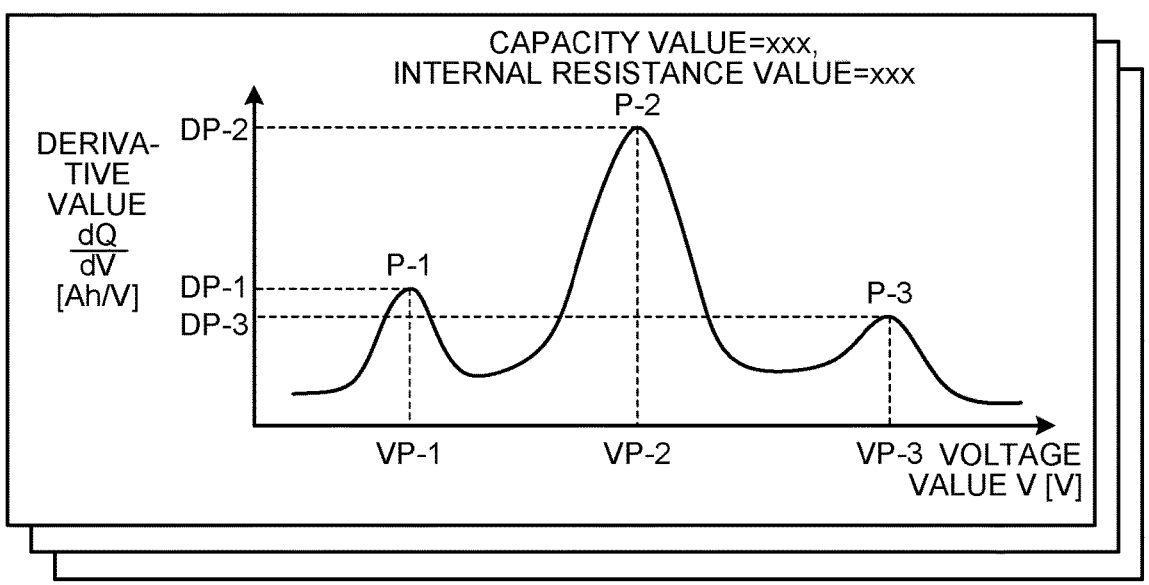
FIG. 5 is a diagram illustrating an example of detecting peaks.

FIG. 5 is a diagram illustrating an example of detecting the peaks P. In this example, three peaks P are detected. In order to distinguish among the peaks P, they are referred to and illustrated as peaks P-1, P-2, P-3, and so on. Each peak P can be distinguished (identified) based on the magnitude and the scope of the corresponding voltage value V. For example, each peak P is distinguished according to the voltage V at which the peak P starts appearing (i.e., the starting voltage of the peak P). The differential processing unit 4 detects the voltage value V and the derivative value dQ/dV at each peak P.

The voltage value V at a peak P is also referred to as a voltage value VP. Thus, in order to distinguish among the voltage values VP at the peaks P-1, P-2, P-3, and so on; they are referred to and illustrated as voltage values VP-1, VP-2, VP-3, and so on, respectively.

The derivative value dQ/dV at a peak P is also referred to as a derivative value DP. Thus, in order to distinguish among the derivative values DP at the peaks P-1, P-2, P-3, and so on; they are referred to and illustrated as derivative values DP-1, DP-2, and DP-3, and so on, respectively.

As a result of such detection, regarding each peak P, such data is obtained in which the capacity value as well as the internal resistance value of the reference LiB R is associated (linked) to the concerned voltage value VP as well as the concerned derivative value DP.

FIG. 6 is a diagram illustrating an example of the data corresponding to each peak P. In this example, the internal resistance value is expressed as a resistance value ratio that represents the ratio of the concerned internal resistance value with respect to the pre-degradation internal resistance value (for example, the initial internal resistance value). Thus, if the concerned internal resistance value is same as the pre-degradation internal resistance value, then the resistance value ratio is equal to "1".

With reference to the data of the peak P-1, the capacity value is associated to the voltage value VP-1; the capacity value is associated to the derivative value DP-1; the resistance value ratio is associated to the voltage value VP-1; and the resistance value ratio is associated to the derivative value D. Regarding the other peaks P too, that is, regarding the peaks P-2 and P-3 too, the data is held in an identical manner.

Thus, it can be understood that, as the capacity value or the internal resistance value changes, that is, as the LiB R goes on degradation more; the voltage value VP and the derivative value DP also go on changing.

Figure 7A:
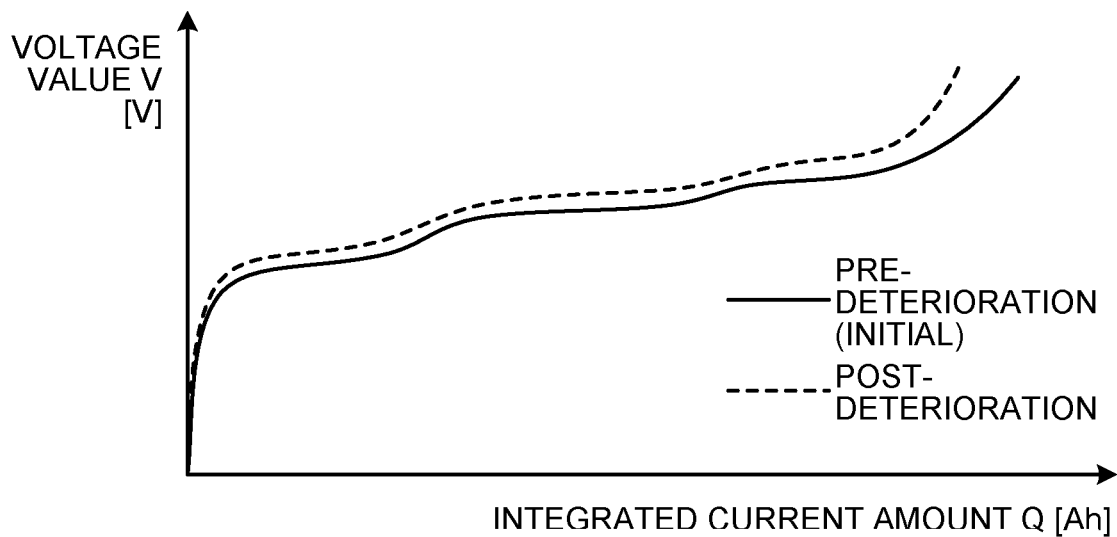
FIG. 7A is a diagram illustrating an example of the degradation occurring in a reference LiB.

FIGS. 7A and 7A each illustrate an example of the degradation occurring in the reference LiB R. FIG. 7A illustrates the charging-discharging curves obtained at the time of performing constant-current charging. The solid-line graph represents the pre-degradation (initial) charging-discharging curve, and the dashed-line graph represents the post-degradation charging-discharging curve.

As the reference LiB R goes on degradation, the voltage value V goes on changing with respect to the same integrated current amount Q. Moreover, as the reference LiB R goes on degradation, there is an increase in the voltage value V in the charging-discharging curve obtained at the time of charging. Accordingly, the chargeable electric energy decreases, and the capacity value of the reference LiB R also becomes smaller. Meanwhile, the changes occurring in the voltage value V are attributed also to the changes occurring in the internal resistance of the reference LiB R.

Figure 7B:
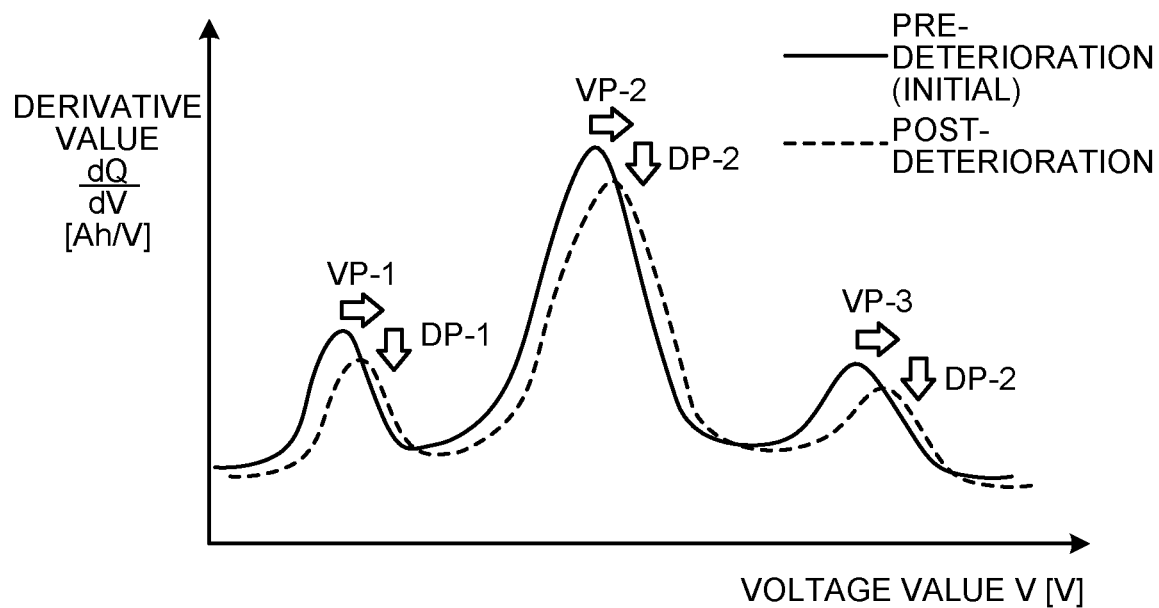
FIG. 7B is another diagram illustrating an example of the degradation occurring in a reference LiB.

FIG. 7B illustrates the differential curves. As schematically illustrated using open arrows, when the reference LiB R goes on degradation, the voltage value VP and the derivative value DP also go on changing. Herein, the changes occurring in the voltage value VP or the derivative value DP have some association (for example, correlation) with the capacity value. Similarly, the changes occurring in the voltage value VP or the derivative value DP have some association with the internal resistance value.

Returning to the explanation with reference to FIG. 1, the regression analysis unit 6 performs regression analysis between a peak P appearing in the differential curve of the reference LiB R and the capacity value or the internal resistance value of the reference LiB R. For example, regression analysis is performed in the following four ways.

Regression analysis of the voltage value VP and the capacity value

Regression analysis between the derivative value DP and the capacity value

Regression analysis between the voltage value VP and the resistance value ratio

Regression analysis between the derivative value DP and the resistance value ratio More particularly, the regression analysis unit 6 calculates a regression function. The constant number and the coefficient in the regression function are referred to as a constant number "a" and a coefficient "k", respectively. Herein, the regression function is assumed to represent a regression line written using a linear function. Regarding the abovementioned four ways of performing regression analysis, the explanation is given below with reference to FIGS. 8 to 11.

Figure 8:
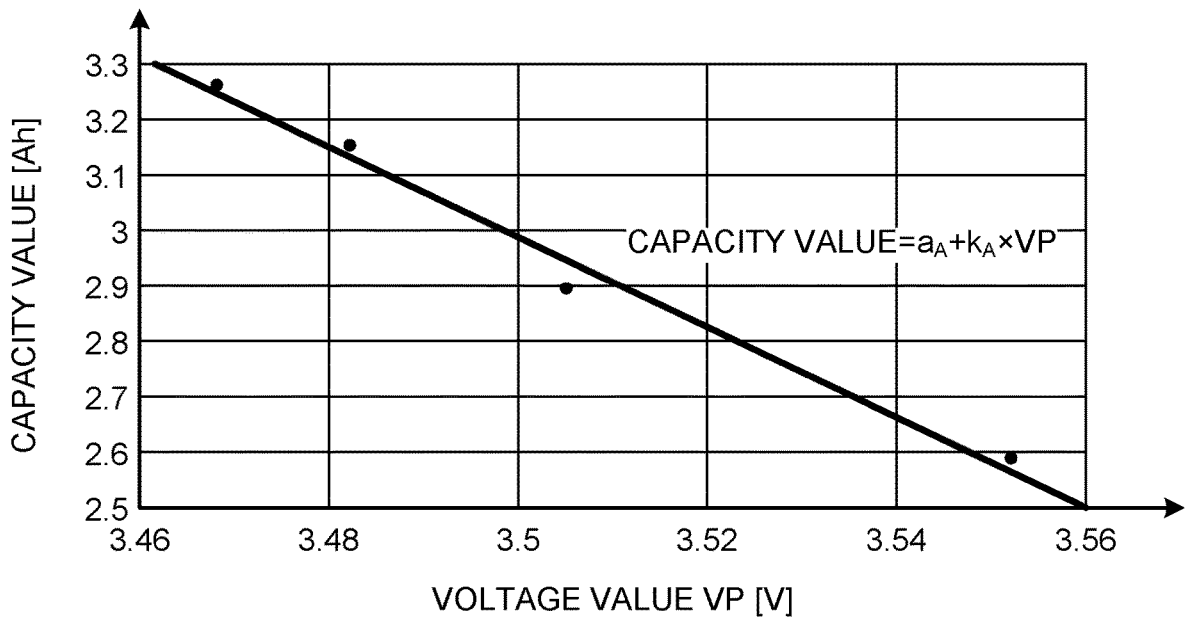
FIG. 8 is a diagram illustrating an example of the regression analysis between a voltage value and a capacity value.

FIG. 8 is a diagram illustrating an example of the regression analysis between the voltage value VP and the capacity value. In the graph, the plotting indicates the values obtained from the reference data 91. As the voltage value VP increases, the capacity value decreases. Thus, a correlation can be seen between the voltage value VP and the capacity value. Based on the reference data 91, the regression analysis unit 6 obtains the regression function represented by the graph line. The regression function is expressed using, for example, Equation (1) given below. In Equation (1), a constant number $a_A$ and a coefficient $k_A$ represent an example of the constant number "a" and the coefficient "k", respectively.

$$\text{Capacity value} = a_A + k_A \times VP \quad (1)$$

Figure 9:
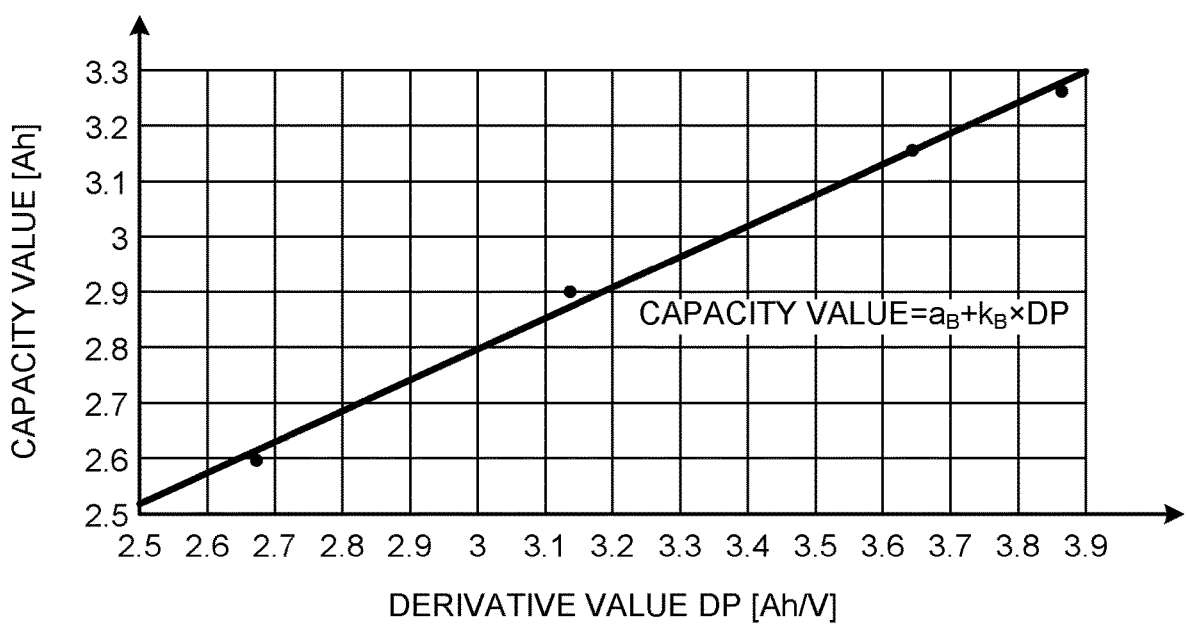
FIG. 9 is a diagram illustrating an example of the regression analysis between a derivative value and a capacity value.

FIG. 9 is a diagram illustrating an example of the regression analysis between the derivative value DP and the capacity value. As the derivative value DP increases, the capacity value also increases. Thus, a correlation can be seen between the derivative value DP and the capacity value. The regression function is expressed using, for example, Equation (2) given below. In Equation (2), a constant number $a_B$ and a coefficient $k_B$ represent an example of the constant number "a" and the coefficient "k", respectively.

$$\text{Capacity value} = a_B + k_B \times DP \quad (2)$$

Figure 10:
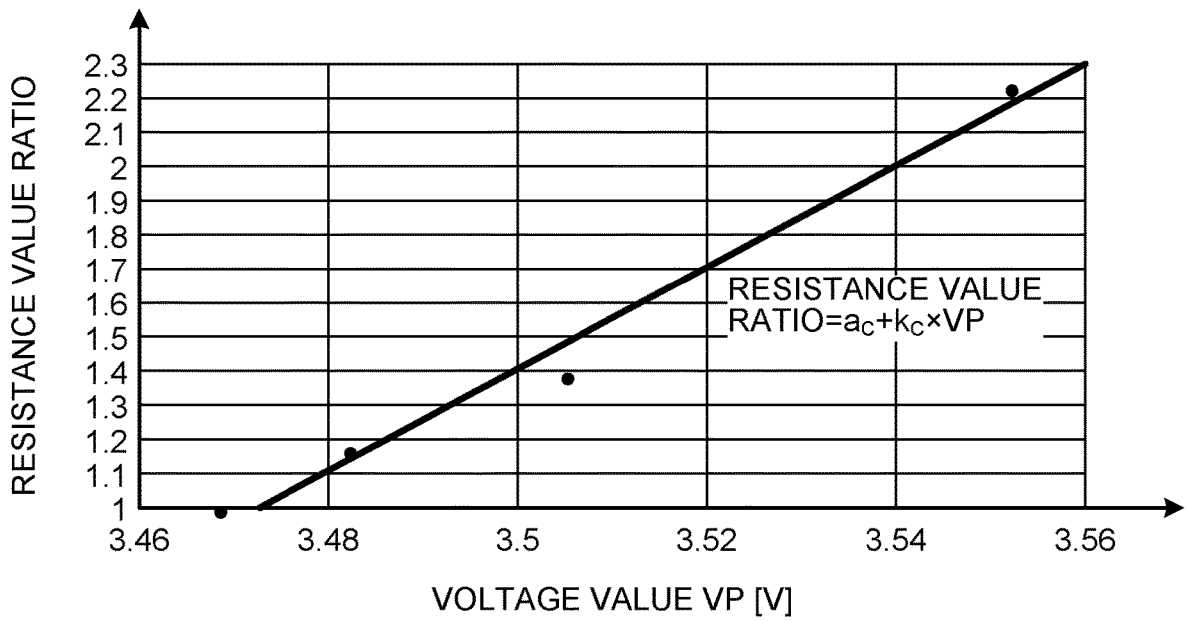
FIG. 10 is a diagram illustrating an example of the regression analysis between a voltage value and a resistance value ratio.

FIG. 10 is a diagram illustrating an example of the regression analysis between the voltage value VP and the resistance value ratio. As the voltage value VP increases, the resistance value ratio also increases. Thus, a correlation can be seen between the voltage value VP and the resistance value ratio. The regression function is expressed using, for example, Equation (3) given below. In Equation (3), a constant number $a_C$ and a coefficient $k_C$ represent an example of the constant number "a" and the coefficient "k", respectively.

$$\text{Resistance value ratio} = a_C + k_C \times VP \quad (3)$$

Figure 11:
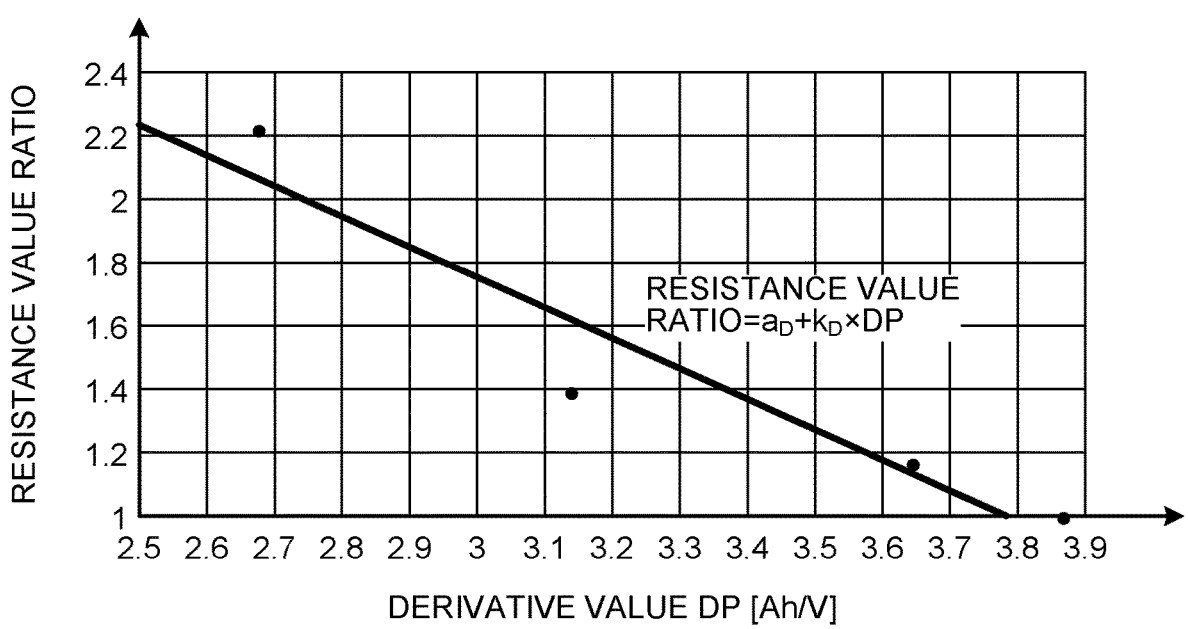
FIG. 11 is a diagram illustrating an example of the regression analysis between a derivative value and a resistance value ratio.

FIG. 11 is a diagram illustrating an example of the regression analysis between the derivative value DP and the resistance value ratio. As the derivative value DP increases, the resistance value ratio decreases. Thus, a correlation can be seen between the derivative value DP and the resistance value ratio. The regression function is expressed using, for example, Equation (4) given below. In Equation (4), a constant number $a_D$ and a coefficient $k_D$ represent an example of the constant number "a" and the coefficient "k", respectively.

$$\text{Resistance value ratio} = a_D + k_D \times DP \quad (4)$$

For example, the constant number "a" and the coefficient "k" are calculated by the regression analysis unit 6. Moreover, a correlation coefficient of the regression function too can be calculated using the regression analysis unit 6. The result of regression analysis includes the constant number "a", the coefficient "k", and the correlation coefficient of each of plurality of regression functions corresponding to a plurality of peaks P. In the following explanation, the constant number "a" and the coefficient "k" are collectively referred to as the coefficient "k" et cetera.

FIG. 12 is a diagram illustrating an example of the result of regression analysis. Herein, each peak P is associated to the coefficient "k" et cetera and the correlation coefficient. In this example, each of the peaks P-1 to P-3 is associated to: the coefficient $k_A$ et cetera and the correlation coefficient of the corresponding regression function; the coefficient $k_B$ et cetera and the correlation coefficient of the corresponding regression function; the coefficient $k_C$ et cetera and the correlation coefficient of the corresponding regression function; and the coefficient $k_D$ et cetera and the correlation coefficient of the corresponding regression function.

Returning to the explanation with reference to FIGS. 7A and 7B, the peak determining unit 7 selects a peak P and the coefficient "k" et cetera that are suitable for estimating the capacity value or the internal resistance value in the estimation stage (explained later) For example, the peak P at which the correlation coefficient of the regression function is closest to "1" is selected, or the peak P at which the correlation coefficient of the regression function is equal to or greater than a threshold value is selected. Herein, in proportion to the proximity of the threshold value to "1", only the peak P having a strong correlation is selected, and the peaks P having a weak correlation are not selected. The threshold value is set to 0.96, for example.

In the examples explained above, as the coefficients "k" related to the capacity value, two coefficients "k", namely, the coefficients $k_A$ and $k_B$ are available. Thus, the peak P for which at least either the regression function corresponding to the coefficient $k_A$ or the regression function corresponding to the coefficient $k_B$ satisfies the selection condition can be selected along with the coefficient "k" et cetera satisfying that condition. In an identical manner, as the coefficients "k" related to the resistance value ratio, two coefficients "k", namely, the coefficients $k_C$ and $k_D$ are available. Thus, the peak P for which at least either the regression function corresponding to the coefficient $k_C$ or the regression function corresponding to the coefficient $k_D$ satisfies the selection condition can be selected along with the coefficient "k" et cetera satisfying that condition. The data containing the selected peak P and the selected coefficient "k" et cetera is stored as the coefficient data 92 in the memory unit 9.

FIG. 13 is a diagram illustrating an example of the coefficient data 92. The coefficient data 92 contains data for capacity value estimation and data for internal resistance value estimation. In the data for capacity value estimation, the peak P and the coefficient "k" et cetera that are suitable for the estimation of the capacity value (in this example, the peak P-2 and the coefficient $k_A$ et cetera) are specified along with a charging-discharging current value that indicates the current value I at the time of performing charging or discharging.

In the data for internal resistance value estimation, the peak P and the coefficient "k" et cetera that are suitable for the estimation of the internal resistance value (in this example, the peak P-2 and the coefficient $k_C$ et cetera) are specified along with the initial internal resistance value and the charging-discharging current value. The initial internal resistance value represents the pre-degradation internal resistance value having the resistance value ratio equal to "1".

Returning to the explanation with reference to FIG. 1, the estimation performed by the estimating unit 8 is an operation not performed in the preparatory stage but performed in the estimation stage (explained later).

Figure 14:
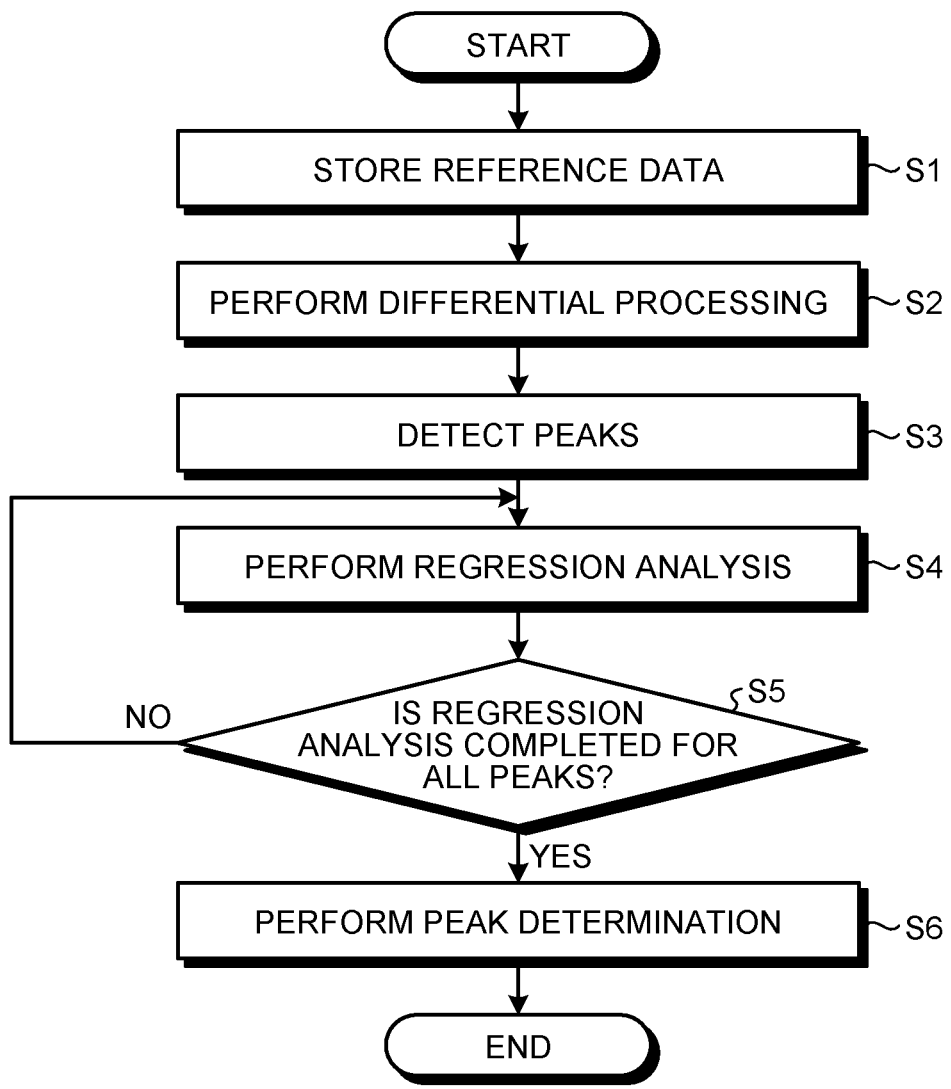
FIG. 14 is a flowchart for explaining an example of the preparation (manufacturing method) regarding the estimation system according to one or more embodiments.

FIG. 14 is a flowchart for explaining an example of the preparation (manufacturing method) regarding the estimation system 1. Herein, regarding the content that is already explained, the explanation is not given again.

At Step S1, the reference data 91 is stored. The charging-discharging measurement device 30 charges and discharges the reference LiB R for each different degree of degradation (for each different capacity value or each different internal resistance value). The communication unit 2 of the estimation system 1 obtains, from the charging-discharging measurement device 30, the data of the reference LiB R during charging and discharging. The obtained data as well as the capacity value and the internal resistance value calculated by the calculating unit C are stored as the reference data 91 in the memory unit 9. The corresponding details are already explained earlier with reference to FIG. 2.

At Step S2, differential processing is performed. The differential processing unit 4 of the estimation system 1 generates a differential curve for each different degree of degradation. The corresponding details are already explained earlier with reference to FIGS. 3 and 4.

At Step S3, the peaks P are detected. The peak detecting unit 5 of the estimation system 1 detects one or more peaks P appearing in a differential curve, and detects the voltage value VP and the derivative value DP at each peak P. If a plurality of peaks P is detected; then, for each peak P, such data is obtained in which the capacity value as well as the internal resistance value of the reference LiB R is associated to the concerned voltage value VP as well as the concerned derivative value DP. The corresponding details are already explained earlier with reference to FIGS. 5 and 6.

At Steps S4 and S5, regression analysis is performed regarding each peak P. At Step S4, the regression analysis unit 6 of the estimation system 1 performs regression analysis for the voltage value VP and the derivative value DP at a single peak P (for example, the peak P-1) with the capacity value or the internal resistance value. Hence, the coefficient "k" et cetera of the regression function is calculated along with the correlation coefficient. At Step S5, if regression analysis is completed regarding all peaks P (Yes at Step S5), then the system control proceeds to Step S6. However, if regression analysis is not yet completed regarding all peaks P (No at Step S5), then the system control returns to Step S4 and regression analysis is performed regarding another peak P (for example, the peak P-2 or the peak P-3). As a result, the regression analysis result is obtained as explained earlier with reference to FIG. 12.

At Step S6, peak determination is performed. The peak determining unit 7 selects a peak P and the coefficient "k" et cetera that are suitable for the estimation of the capacity value or the internal resistance value. The coefficient data 92 containing the selected peak P and the selected coefficient "k" et cetera is stored in the memory unit 9. The corresponding details are already explained earlier with reference to FIG. 13.

When the operation at Step S6 is completed, it marks the end of the operations illustrated in the flowchart.

For example, regarding the estimation system 1 in which the coefficient data 92 is stored in the memory unit 9, the preparation is completed in the manner explained above. Then, the coefficient data 92 can be utilized and the capacity value or the internal resistance value of the target LiB for estimation can be estimated as explained below.

Estimation Stage

Explained below with reference to FIGS. 15 to 20 is an example of the estimation performed in the estimation system 1.

Figure 15:
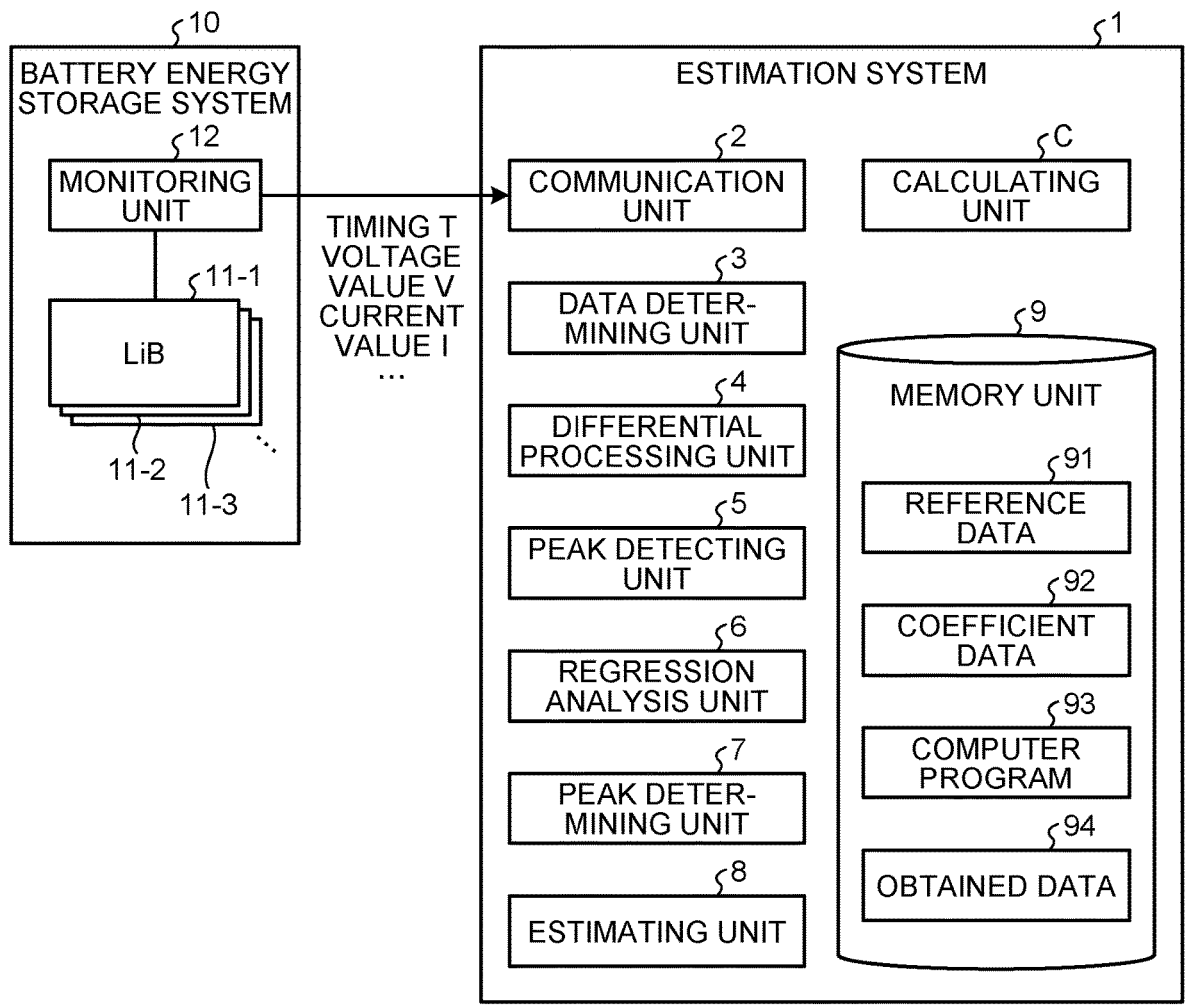
FIG. 15 is a diagram illustrating an exemplary overall configuration of the estimation system according to one or more embodiments in an estimation stage.

FIG. 15 is a diagram illustrating an exemplary overall configuration of the estimation system 1 in the estimation stage. In this example, the estimation system 1 estimates the capacity value or the internal resistance value of storage batteries 11 constituting a battery energy storage system 10 in operation. The estimation system 1 in the estimation stage can be used at a different location than the location of the estimation system 1 in the preparatory stage as explained earlier with reference to FIG. 1, or can be implemented using a different device than the estimation system 1 in the preparatory stage.

The battery energy storage system 10 includes the storage batteries 11 and a monitoring unit 12. In this example, a plurality of storage batteries 11 is used by connecting them in series or in parallel. The storage batteries 11 used in such a state are also called a battery module or a battery unit. In order to distinguish among the storage batteries 11, they are referred to and illustrated as storage batteries 11-1, 11-2, 11-3, and so on.

The target LiB 11 for estimation has identical characteristics to the reference LiB R explained earlier (see FIG. 1). For example, the LiB 11 and the reference LiB R have the same manufacturer, the same model number, and the same design specifications (the material constitution).

For example, the monitoring unit 12 monitors each LiB 11 by detecting, at regular intervals, the voltage value V and the current value I of that LiB 11. Then, the monitoring unit 12 outputs, to the outside, the charging-discharging data containing the voltage value V and the current value I. Moreover, the charging-discharging data can also contain identification information (ID) enabling identification of the LiB 11.

The communication unit 2 of the estimation system 1 communicates with the battery energy storage system 10 and obtains (receives) the charging-discharging data from the battery energy storage system 10, that is, obtains (receives) the timing T, the voltage value V, and the current value I regarding each LiB 11. The data obtained by the communication unit 2 is stored as obtained data 94 in the memory unit 9.

Figure 16:
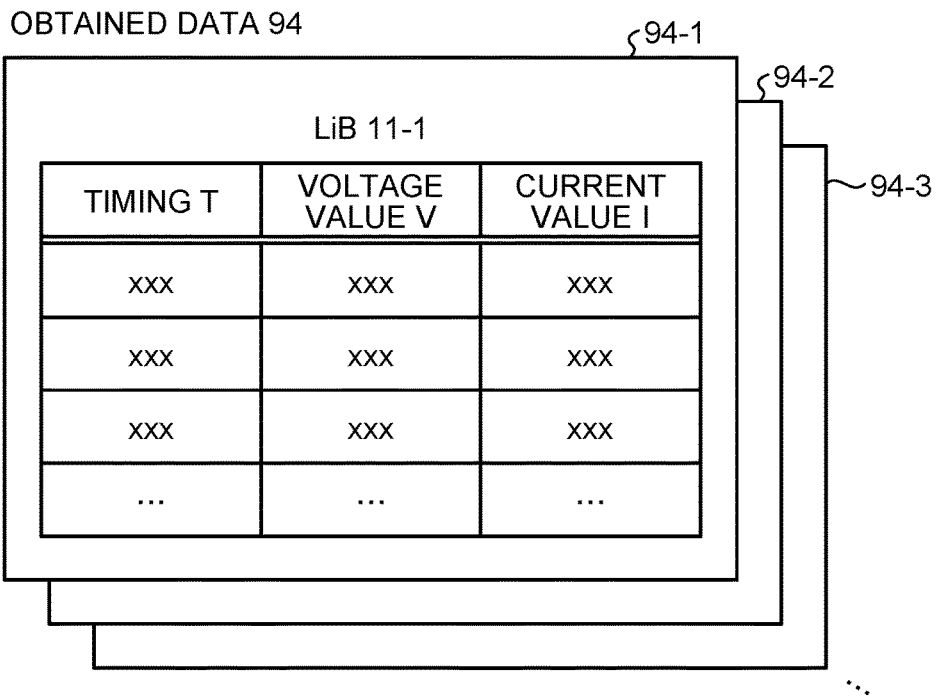
FIG. 16 is a diagram illustrating an example of obtained data.

FIG. 16 is a diagram illustrating an example of the obtained data 94. In the obtained data 94, regarding each LiB 11; the timing T, the voltage value V, and the current value I are held in a corresponding manner. The sets of obtained data 94 corresponding to the storage batteries 11 are referred to and illustrated as sets of obtained data 94-1, 94-2, 94-3, and so on.

Meanwhile, the data that is obtained from the battery energy storage system 10 in operation is often limited to the data of only some portion of the available voltage range of the storage batteries 11. The obtained data 94 can be such limited data.

Figure 17:
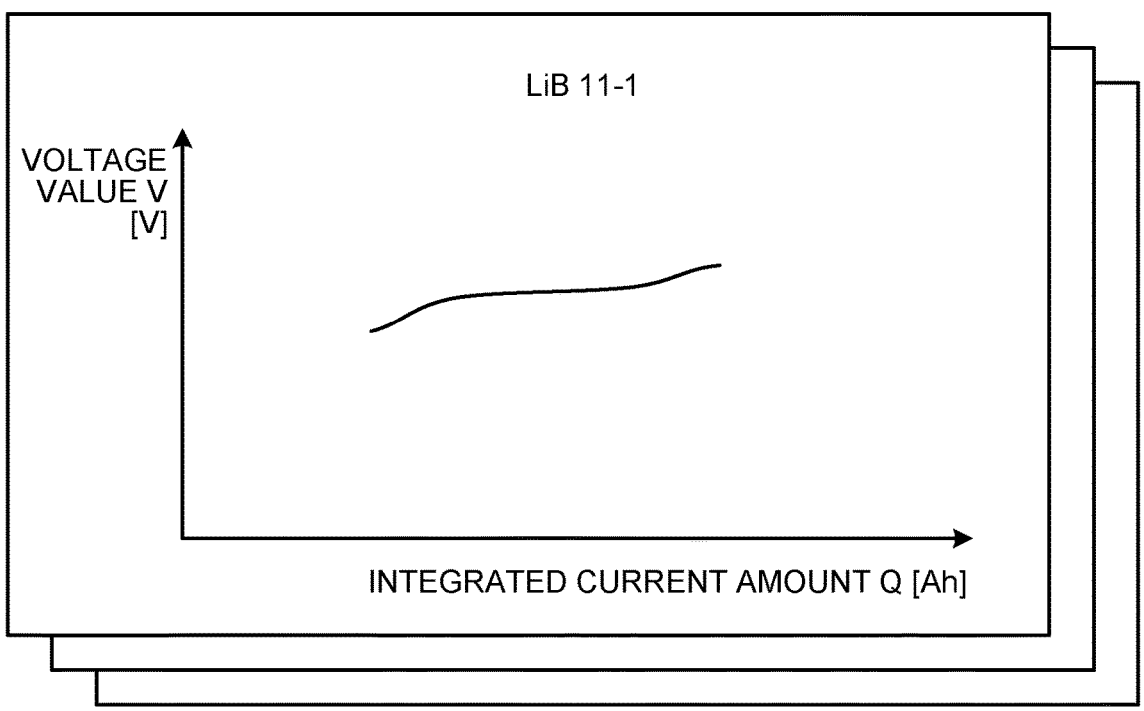
FIG. 17 is a diagram illustrating an example of a charging-discharging curve corresponding to FIG. 16.

FIG. 17 is a diagram illustrating an example of a charging-discharging curve corresponding to FIG. 16. Regarding each LiB 11, a charging-discharging curve as illustrated in FIG. 17 (in this example, a partial charging-discharging curve) is obtained.

Returning to the explanation with reference to FIG. 15, the calculating unit C performs calculation not in the estimation stage but in the estimation stage explained earlier.

The data determining unit 3 determines whether or not the obtained data 94 is analyzable. More particularly, it is determined whether or not the obtained data 94 can be used in estimating the capacity value or the internal resistance value of the LiB 11. Regarding the determination, some specific examples are explained below.

For example, when the obtained data 94 is obtained at the time of charging, if the voltage value V at the start of charging is equal to or smaller than the voltage at which the peak P specified in the coefficient data 92 starts appearing (i.e., the starting voltage for the peak P), then it is determined that the obtained data 94 is analyzable. That is because the voltage value V goes on increasing as the charging continues; and it is highly likely that the data containing the portion before and after the peak P is obtained during the charging.

Moreover, for example, when the obtained data 94 is obtained at the time of discharging, if the obtained data 94 contains the voltage value V equal to or greater than the starting voltage for the peak P specified in the coefficient data 92, then it is determined that the obtained data 94 is analyzable. That is because the voltage value V goes on decreasing as the discharging continues; and it is highly likely that the data containing the portion before and after the peak P is obtained during the discharging.

Furthermore, for example, if the current value I specified in the obtained data 94 is essentially same as the charging-discharging current value specified in the coefficient data 92, then it is determined that the obtained data 94 is analyzable. Herein, if the difference between those two types of current values is smaller than a threshold value or if their ratio is within a predetermined range, then it can be determined that the current values are essentially same and that the obtained data 94 is analyzable. Thus, the impact of the fact that the charging-discharging curve is dependent on the current values can be reduced or avoided, thereby enabling achieving equivalent enhancement in the estimation accuracy for the estimating unit 8 (explained later).

The differential processing unit 4 generates, for each LiB 11 (for each set of obtained data 94), a differential curve based on the obtained data 94 that the data determining unit 3 has determined to be analyzable.

Figure 18:
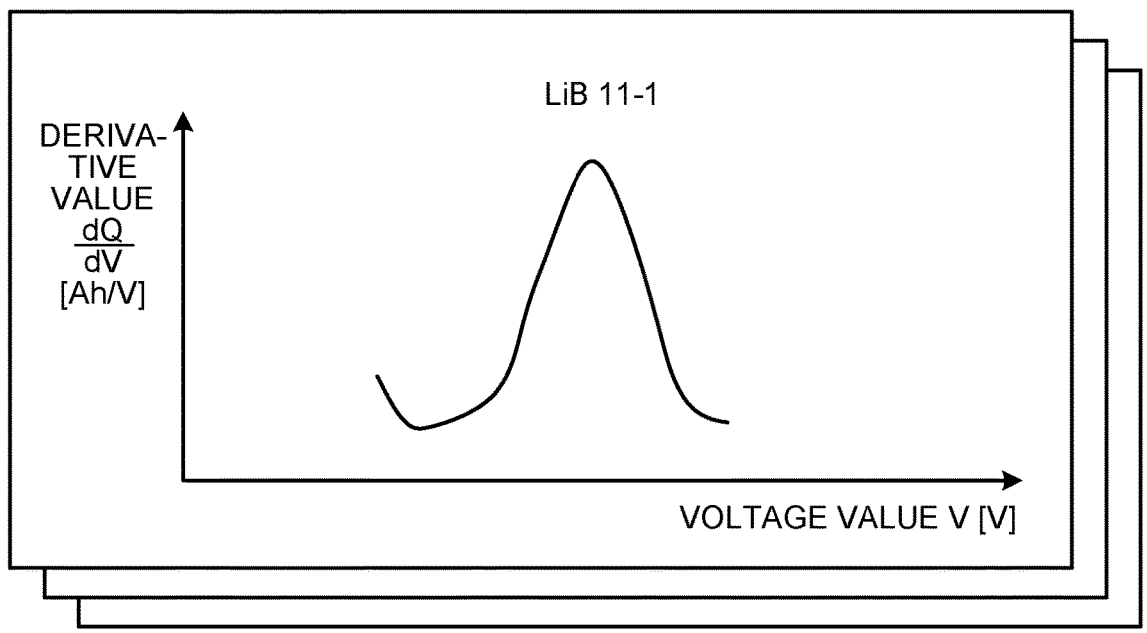
FIG. 18 is a diagram illustrating an example of a differential curve corresponding to FIG. 17.

FIG. 18 is a diagram illustrating an example of a differential curve corresponding to FIG. 17. In a corresponding manner to the charging-discharging curve explained earlier with reference to FIG. 17, a differential curve is generated as illustrated in FIG. 18 (in this example, a partial differential curve) for each LiB 11.

Returning to the explanation with reference to FIG. 15, the peak detecting unit 5 detects the peaks P appearing on each differential curve generated by the differential processing unit 4, and detects the voltage value V and the derivative value dQ/dV at each peak P.

Figure 19:
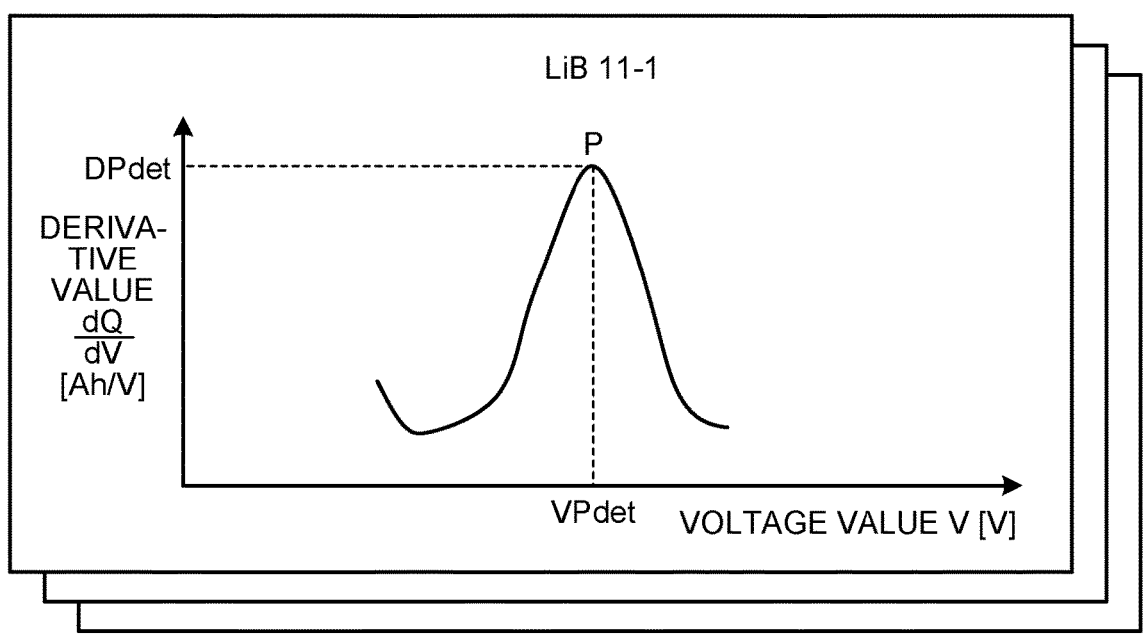
FIG. 19 is a diagram illustrating an example of detecting a peak.

FIG. 19 is a diagram illustrating an example of detecting a peak P. In this example, a single peak P (equivalent to the peak P-2, for example) is detected along with the voltage value V and the derivative value dQ/dV at that peak P. Herein, the detected voltage value V and the detected derivative value dQ/dV are referred to and illustrated as a voltage value VPdet and a derivative value DPdet, respectively.

Moreover, the peak detecting unit 5 determines whether or not the detected peak P is a complete peak. For example, when a peak P as well as the base portion thereof is included in the differential curve, that peak P can be determined to be a complete peak. That is because the peak P can be appropriately detected. Moreover, if the impact at the time of starting the charging or starting the discharging (i.e., the transient increase in the charging-discharging current) is not included in the differential curve, then the peak P can be determined to be a complete peak. That is because the voltage value VPdet and the derivative value DPdet can be appropriately detected.

Returning to the explanation with reference to FIG. 15, the regression analysis performed by the regression analysis unit 6 and the determination performed by the peak determining unit 7 are operations not performed in the estimation stage but performed in the estimation stage explained earlier.

The estimating unit 8 estimates the capacity value and the internal resistance value of the LiB 11 based on the analysis result obtained by the regression analysis unit 6 obtained in the earlier estimation stage, that is, based on the coefficient data 92, and also based on the values related to the peaks P appearing in the differential curve of the concerned LiB 11 as detected by the peak detecting unit 5.

The estimation performed by the estimating unit 8 includes the multiplication of the coefficient "k" with the value related to P, that is, with the voltage value VPdet or the derivative value DPdet. The specific explanation is given below.

The following explanation is given about the estimation of the capacity value. When the coefficient $k_A$ represents the coefficient "k" specified by the coefficient data 92, the estimating unit 8 calculates the capacity value of the concerned LiB 11 using, for example, Equation (5) given below. In Equation (5), the voltage value VP used in Equation (1) given earlier is replaced by the voltage value VPdet. Moreover, Equation (5) includes the multiplication of the coefficient $k_A$ and the voltage value VPdet.

$$\text{Capacity value} = a_A + k_A \times VP \text{ det} \quad (5)$$

When the coefficient $k_B$ represents the coefficient "k" specified by the coefficient data 92, the estimating unit 8 calculates the capacity value of the concerned LiB 11 using, for example, Equation (6) given below. In Equation (6), the derivative value DP used in Equation (2) given earlier is replaced by the derivative value DPdet. Moreover, Equation (6) includes the multiplication of the coefficient $k_B$ and the derivative value DPdet.

$$\text{Capacity value} = a_B + k_B \times DP \text{ det} \quad (6)$$

The following explanation is given about the estimation of the internal resistance value. When the coefficient $k_C$ represents the coefficient "k" specified by the coefficient data 92, the estimating unit 8 calculates the internal resistance value of the concerned LiB 11 using, for example, Equation (7) given below. In Equation (7), $r_0$ represents the initial internal resistance value. Moreover, in Equation (7), the initial internal resistance value $r_0$ is multiplied to the resistance value ratio calculated after replacing the voltage value VP, which is used in Equation (3) given earlier, with the voltage value VPdet. Furthermore, Equation (7) includes the multiplication of the coefficient $k_C$ and the voltage value VPdet.

$$\text{Internal resistance value} = (a_C + k_C \times VP \text{ det}) \times r_0 \quad (7)$$

When the coefficient $k_D$ represents the coefficient "k" specified by the coefficient data 92, the estimating unit 8 calculates the internal resistance value of the concerned LiB 11 using, for example, Equation (8) given below. In Equation (8), the initial internal resistance value $r_0$ is multiplied to the resistance value ratio calculated after replacing the derivative value DP, which used in Equation (4) given earlier, with the derivative value DPdet. Moreover, Equation (8) includes the multiplication of the coefficient $k_D$ and the derivative value DPdet.

$$\text{Internal resistance value} = (a_D + k_D \times DP \text{ det}) \times r_0 \quad (8)$$

As explained above, the coefficient "k" specified in the coefficient data 92 is selected by the peak determining unit 7 in the preparatory stage of the estimation system 1. For example, if the peak determining unit 7 selects the peak P at which the correlation coefficient of the regression function is closest to "1", then the multiplication related to the coefficient "k" in Equation (5) to Equation (8) is performed as the multiplication of the coefficient "k" of the regression function having the correlation coefficient closest to "1" with the voltage value VPdet or the derivative value DPdet at the peak P corresponding to that regression function. If the peak determining unit 7 selects the peak P at which the correlation coefficient of the regression function is equal to or greater than a threshold value, then the multiplication is performed as the multiplication of the coefficient "k" of the regression function having the correlation equal to or greater than the threshold value with the voltage value VPdet or the derivative value DPdet at the peak P corresponding to that regression function.

For example, as explained above, the capacity value and the internal resistance value of the LiB 11 are estimated by estimating unit 8. Then, the estimation result obtained by the estimating unit 8, that is, the capacity value and the internal resistance value of the LiB 11 can be output in, for example, a format that is usable by the user (such as displaying or outputting data).

Figure 20:
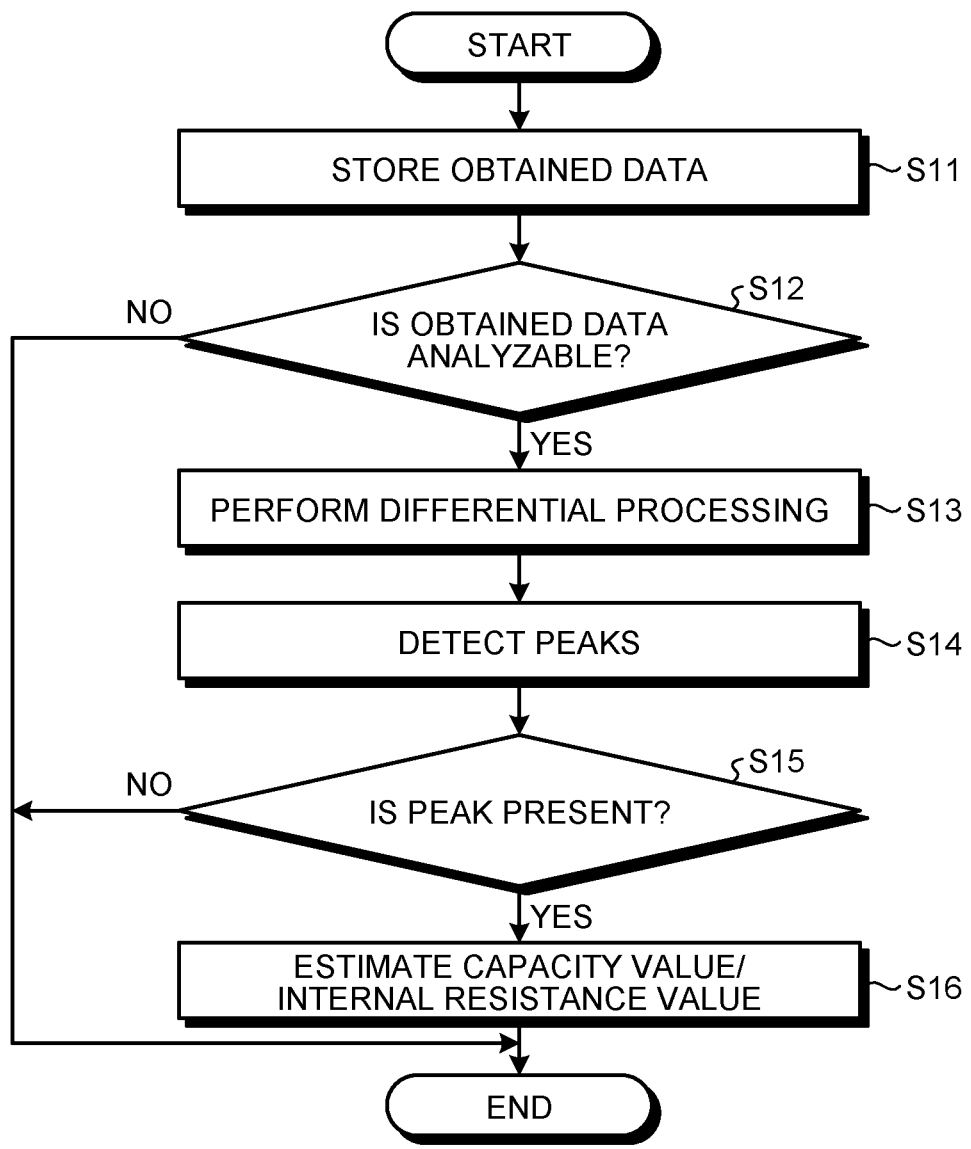
FIG. 20 is a flowchart for explaining the estimation of the capacity value and the internal resistance value (i.e., explaining the estimation method) performed in the estimation system according to one or more embodiments.

FIG. 20 is a flowchart for explaining the estimation of the capacity value and the internal resistance value (i.e., explaining the estimation method) performed in the estimation system 1. Regarding the content that is already explained, the explanation is not given again.

At Step S11, the obtained data 94 is stored. In the battery energy storage system 10 in operation, charging and discharging of the storage batteries 11 is carried out. The communication unit 2 of the estimation system 1 obtains the charging-discharging data of each LiB 11 from the monitoring unit 12 of the battery energy storage system 10. The obtained storage data is then stored as the obtained data 94 in the memory unit 9. The corresponding details are already explained earlier with reference to FIG. 16.

At Step S12, it is determined whether or not the obtained data 94 is analyzable. The data determining unit 3 of the estimation system 1 determines whether or not the obtained data 94 is analyzable. If the obtained data 94 is analyzable (Yes at Step S12), then the system control proceeds to Step S13. On the other hand, if that obtained data 94 is not analyzable (No at Step S12), then it marks the end of the operations illustrated in the flowchart.

At Step S13, the differential processing is performed. The differential processing unit 4 of the estimation system 1 generates a differential curve for each LiB 11 (i.e., for each set of obtained data 94). The corresponding details are already explained earlier with reference to FIGS. 17 and 18.

At Step S14, the peaks are detected. The peak detecting unit 5 of the estimation system 1 detects the peaks P appearing in each differential curve, and detects the voltage value VPdet and the derivative value DPdet at each peak P. Moreover, the peak detecting unit 5 determines whether or not any detected peak P is a complete peak.

At Step S15, it is determined whether or not a peak P is present. The peak detecting unit 5 of the estimation system 1 determines the presence of a peak P when a complete peak P is detected. If a peak P is present (Yes at Step S15), then the system control proceeds to Step S16. On the other hand, if a peak P is not present (No at Step S15), then it marks the end of the operations illustrated in the flowchart.

At Step S16, the capacity value and the internal resistance value are estimated. The estimating unit 8 of the estimation system 1 estimates the capacity value and the internal resistance value of each LiB 11 based on the coefficient data 92, the voltage value VPdet, and the derivative value DPdet. For example, the capacity value and the internal resistance value are calculated using, for example, Equations (5) to (8) given earlier.

After the operation at Step S16 is completed, it marks the end of the operations illustrated in the flowchart.

For example, the capacity value and the internal resistance value of each LiB 11 are estimated in the manner explained above.

In the estimation method explained above, based on the coefficient data 92 prepared in advance using the reference LiB R (i.e., based on the result of regression analysis) and based on the obtained data 94 obtained in regard to the concerned LiB 11, the capacity value and the internal resistance value of that LiB 11 can be estimated. Regarding the obtained data 94, as long as the data corresponding to at least a single peak P is available, it serves the purpose. Hence, the capacity value and the internal resistance value of the LiB 11 can be estimated even from only a limited volume of data that can be obtained from the battery energy storage system 10 in operation. For example, even if the remaining battery level or the battery capacity is not balanced out among a plurality of storage batteries 11, it still becomes able to estimate the capacity value and the internal resistance value of each LiB 11.

Moreover, since the data output by the battery energy storage system 10 is used as the obtained data 94, the capacity value and the internal resistance value of the storage batteries 11 can be estimated without having to install a dedicated measurement device such as the charging-discharging measurement device 30 explained earlier with reference to FIG. 1.

MODIFICATION EXAMPLES

The technology disclosed herein is not limited to the embodiment described above. Given below is the explanation of a few modification examples.

In the embodiments described above, the explanation is given about the case in which regression analysis and estimation is performed regarding the capacity value as well as the internal resistance value. Alternatively, regression analysis and estimation can be performed regarding only either the capacity value or the internal resistance value.

In the embodiments described above, the explanation is given about the case in which dQ/dV (Ah/V) represents the derivative value illustrated in a differential curve. Alternatively, dV/dQ (V/Ah) can represent the derivative value. In that case, in the differential curve, the point at which the derivative value dV/dQ is the smallest (i.e., the bottom) can represent a feature point. Herein, the bottom can be interpreted to include the local minimum.

In the embodiments described above, the explanation is given about the case in which the capacity value is expressed as the integrated current amount (Ah). Alternatively, various other indexes can be used in place of the integrated current amount.

In the embodiments described above, the explanation is given about the case in which, in the preparatory stage of the estimation system 1, the coefficient data 92 containing the peak P selected by the peak determining unit 7 and containing the coefficient "k" et cetera is stored in the memory unit 9. Alternatively, such selection need not be performed in the preparatory stage. In that case, for example, the result of regression analysis as obtained by the regression analysis unit 6 and as illustrated in FIG. 6 can be stored without modification as the coefficient data 92 in the memory unit 9. Then, in the estimation stage in which the capacity value and the internal resistance value are estimated in the estimation system 1, the peak P and the coefficient "k" et cetera to be used for the capacity value and the internal resistance value can be appropriately selected from the coefficient data 92.

In the embodiments described above, the explanation is given about the case in which, in the regression analysis, the capacity value is expressed without modification and the internal resistance value is expressed as the resistance value ratio. Alternatively, the capacity value can be expressed as the capacity value ratio (the ratio with respect to the initial capacity value), and the internal resistance value can be expressed without modification.

The coefficient data 92 that is stored in the memory unit 9 of the estimation system 1 can be updated. For example, where there are minor changes in the battery capacity of any LiB 11, the coefficient "k" et cetera can be changed (overwritten) accordingly. Since it is required to make only minor changes, there is no need to again do preparation using the reference LiB R.

In the embodiments described above, the explanation is given about the case in which the coefficient "k" in the regression function is a coefficient for multiplication. Alternatively, the coefficient "k" can be a coefficient for division. The coefficient "k" for multiplication is, for example, the reciprocal of the coefficient "k" for division. In the application concerned, "multiplication" in regard to the coefficient "k" can be interpreted to include "division".

In the embodiments described above, the explanation is given about the case in which the regression function is described in terms of a single linear function. Alternatively, various other types of regression functions can also be used. Particularly, a different type of regression function is useful regarding a LiB for which an appropriate regression function is difficult to obtain using only a single linear function. The explanation is given below with reference to FIG. 21.

Figure 21:
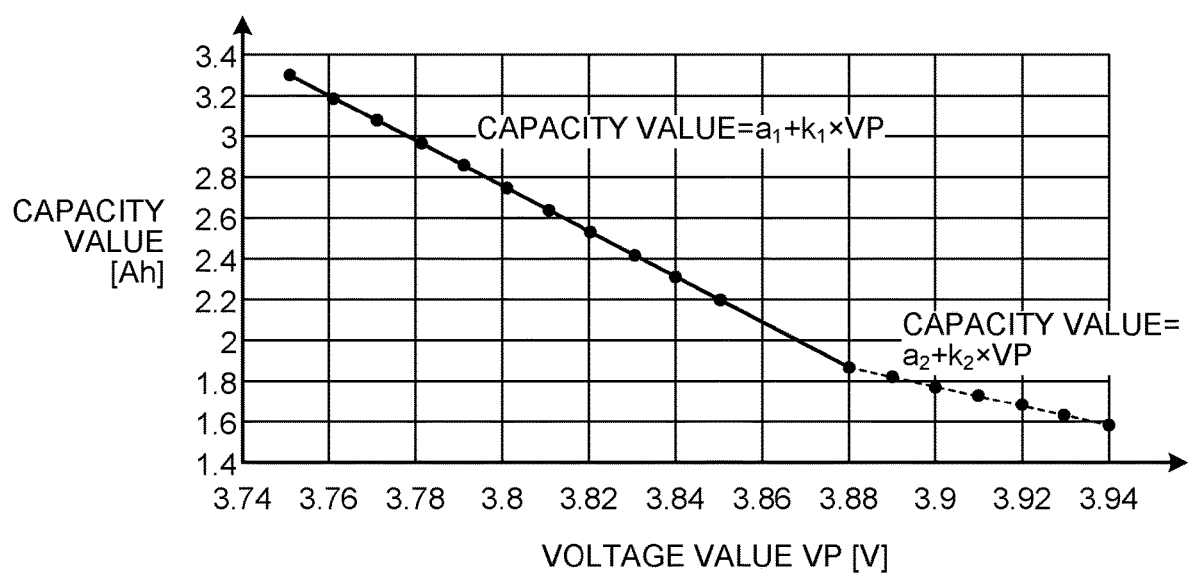
FIG. 21 is a diagram illustrating the relationship between the voltage value and the capacity value at the peak.

FIG. 21 is a diagram illustrating the relationship between the voltage value VP and the capacity value at the peak P. Unlike the explanation given with reference to FIG. 8, as the degradation goes on increasing (as the capacity value goes on decreasing), the change (inclination) in the capacity value with respect to the voltage value VP becomes more moderate. Thus, it becomes difficult to obtain an appropriate regression function with only a single linear function. Hence, a more complex regression function can be used.

For example, the regression function can be described in terms of a plurality of linear functions each corresponding to a different section. In the example illustrated in FIG. 21, two linear functions illustrated using two types of graph lines are used. The first linear function describes the regression function in a first section in which the degree of degradation of the reference LiB R is relatively less (i.e., the inclination is relatively greater). The second linear function describes the regression function in a second section in which the degree of degradation of the reference LiB R is relatively more (i.e., the inclination is relatively smaller). In this example, the voltage value VP in the first section is smaller than 3.88 V, and the voltage value VP in the second section is equal to or greater than 3.88 V. The regression function is expressed using, for example, Equation (9) given below. In Equation (9), a constant number $a_1$ and a coefficient $k_1$ represent an example of the constant number "a" and the coefficient "k", respectively, in the first linear function. Similarly, in Equation (9), a constant number $a_2$ and a coefficient $k_2$ represent an example of the constant number "a" and the coefficient "k", respectively, in the second linear function.

$$\text{Capacity value} = \begin{array}{l} a_1 + k_1 \times VP (VP < 3.88) \\ a_2 + k_2 \times VP (3.88 \leq VP) \end{array} \quad (9)$$

As might be expected, an identical regression function can be used regarding the following relationships too: the relationship between the derivative value DP and the capacity value; the relationship between the voltage value VP and the resistance value ratio; and the relationship between the derivative value DP and the resistance value ratio.

Meanwhile, the regression function can be described in terms of a multi-order function. In that case, the regression function is expressed using, for example, Equation (10) given below. In Equation (10), a constant number $a_{10}$ represents an example of the constant number "a". A coefficient $k_{11}$ represents an example of the coefficient of the first-order term. A coefficient $k_{12}$ represents an example of the coefficient of the second-order term.

$$\text{Capacity value} = a_{10} + k_{11} \times VP + k_{12} \times VP^2 + \quad (10)$$

As might be expected, regarding the derivative value DP and the resistance value ratio too, a regression function identical to Equation (10) can be used.

The regression function can also be a multiple regression function. In that case, the regression function is expressed using, for example, Equation (11) given below. In Equation (11), a constant number $a_{20}$ represents an example of the constant number "a". A coefficient $k_{21}$ represents an example of the coefficient of a first variable $x_1$. A coefficient $k_{22}$ represents an example of the coefficient of a second variable $x_2$. As an example of the first variable $x_1$, the voltage value VP or the derivative value DP at a particular peak P can be cited. The variable $x_2$ is any variable that can be used in the regression function. Thus, the second variable $x_2$ can be the voltage value VP or the derivative value DP at some other peak P.

$$\text{Capacity value} = a_{20} + k_{21} \times x_1 + k_{22} \times k_{22} + \quad (11)$$

Regarding the resistance value ratio, a regression function identical to Equation (11) given above can be used. Meanwhile, the multiple regression function can be a multi-order function. That is, the regression function can be described in terms of at least either a multi-order function or a multiple regression function.

According to one or more embodiments, the reference function R (see FIG. 1) can represent the target LiB 11 for estimation (FIG. 15). At the time of performing the maintenance of the LiB 11, the data thereof is obtained. For example, the charging-discharging measurement device 30 (see FIG. 1) is connected to the LiB 11, and thus the LiB 11 is charged and discharged. Then, at the time of charging and at the time of discharging the LiB 11, data is obtained that contains the timing T, the voltage value V, the current value I, the capacity value, and the internal resistance value. Then, the data is stored as the reference data 91 in the memory unit 9. As a result of repeatedly performing such maintenance, the data of the LiB 11 at each different degree of degradation is obtained as the reference data 91. Then, based on the reference data 91, the coefficient data 92 is obtained.

As the LiB 11 goes on degradation more, the maintenance is performed in a repeated manner and the reference data 91 gets stored. Moreover, the regression analysis is also performed in a repeated manner by the regression analysis unit 6, and the result of regression analysis is updated along with the coefficient data 92 containing the coefficient "k" et cetera. The coefficient data 92 obtained in this manner represents the coefficient data 92 customized according to the target LiB 11 for estimation. As a result of using the coefficient data 92, it becomes possible to enhance the estimation accuracy of the capacity value or the internal resistance value of the LiB 11. Besides, there is no need to perform regression analysis using some other reference LiB R other than the LiB 11.

Figure 22:
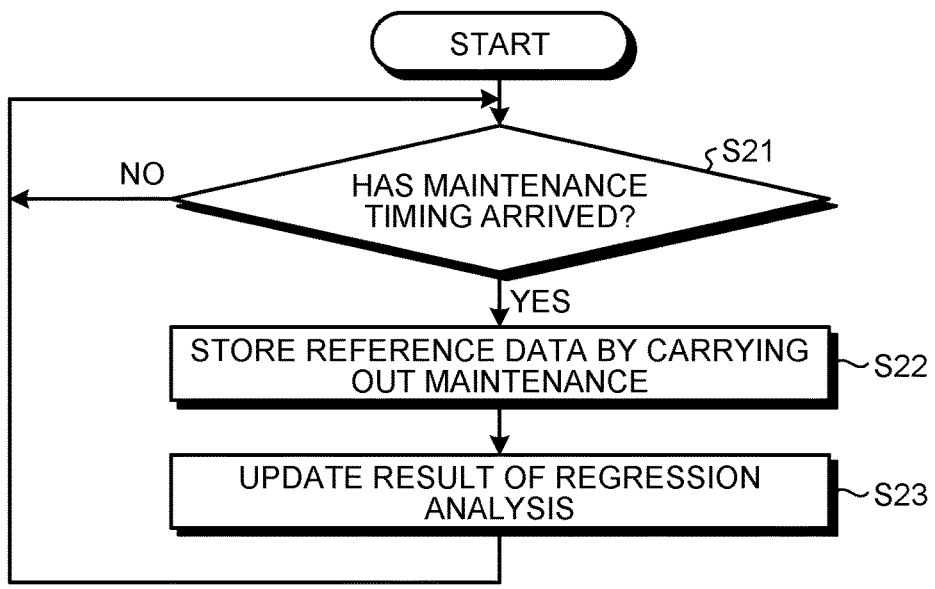
FIG. 22 is a flowchart for explaining an example of updating the result of regression analysis.

FIG. 22 is a flowchart for explaining an example of updating the result of regression analysis. Herein, the premise is that the data at the time of charging and discharging the LiB 11 of the battery energy storage system 10 at the start of its operations has been obtained as the reference data 91, that is, the pre-degradation (initial) data has been obtained as the reference data 91.

At Step S21, it is determined whether or not the maintenance timing has arrived. That determination can be automatically performed in the battery energy storage system 10 or the estimation system 1, or can be performed by the user of the battery energy storage system 10 or the estimation system 1. If the maintenance timing has arrived (Yes at Step S21), then the system control proceeds to Step S22. On the other hand, if the maintenance timing has not yet arrived (No at Step S21), then the operation at Step S21 is performed again.

At Step S22, the maintenance is carried out, and the reference data 91 is stored. For example, at the time when the LiB 11 is charged from the lower limit value to the upper limit value of the available voltage range; the timing T, the voltage value V, the current value I, the capacity value, and the internal resistance value are obtained and added to the reference data 91.

At Step S23, the result of regression analysis is updated. The regression analysis unit 6 of the estimation system 1 performs regression analysis based on the latest set of reference data 91. Then, the result of regression analysis is updated along with the coefficient data 92 containing the coefficient "k" et cetera. After the operation at Step S23 is completed, the system control returns to Step S21.

While the operations explained above are performed in a repeated manner, based on the latest set of coefficient data 92 and based on the charging-discharging data of the LiB 11 obtained from the battery energy storage system 10 in operation, the capacity value and the internal resistance value of the LiB 11 are estimated in a timely manner.

Example of Hardware Configuration

Figure 23:
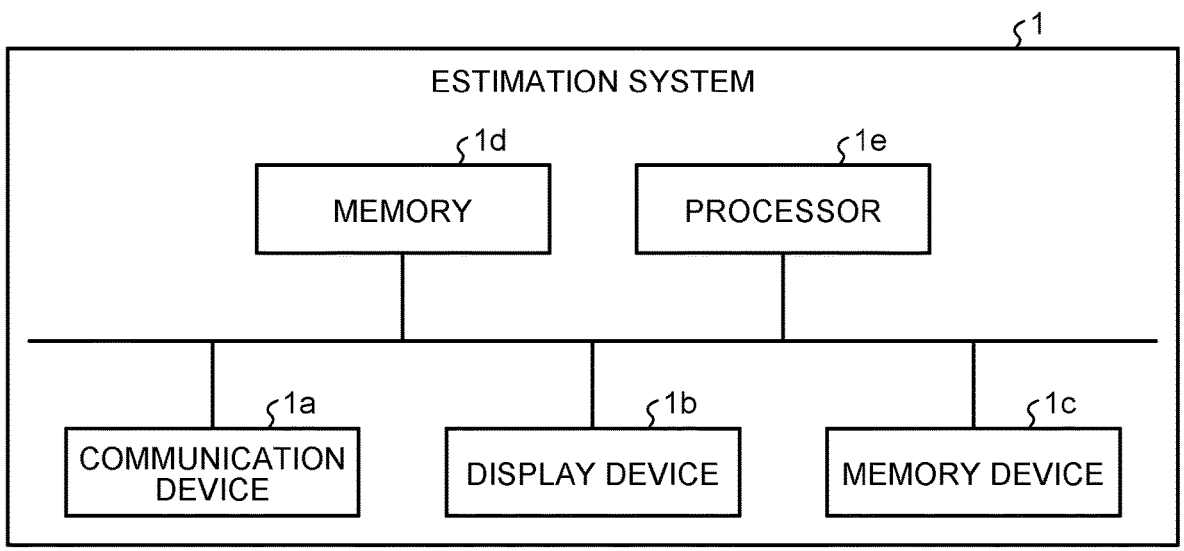
FIG. 23 is a diagram illustrating an exemplary hardware configuration of the estimation system according to one or more embodiments.

FIG. 23 is a diagram illustrating an exemplary hardware configuration of the estimation system 1. For example, one or more devices such as computers having the following hardware configuration function as the estimation system 1 explained above. The hardware configuration includes a communication device 1a, a display device 1b, a memory device 1c, a memory 1d, and a processor 1e that are connected to each other by a bus. Examples of the memory device 1c include a hard disk drive (HDD), a read only memory (ROM), and a random access memory (RAM). The memory 1d can also be included in the memory device 1c.

The communication device 1a is a network interface card that enables communication with other devices. The display device 1b is, for example, a touch-sensitive panel or a display. The memory device 1c functions as the memory unit 9.

The processor 1e reads the computer program 93 (see FIGS. 1 and 15) from the memory device 1c and executes it, so that the concerned computer is made to execute various operations of the estimation system 1. The operations include the operations performed by the data determining unit 3, the differential processing unit 4, the peak detecting unit 5, the regression analysis unit 6, the peak determining unit 7, and the estimating unit 8 as explained earlier.

The computer program 93 can be distributed via a network such as the Internet. Alternatively, the computer program 93 can be recorded in a computer-readable recording medium such as a hard disk, a flexible disk (FD), a compact disc read only memory (CD-ROM), a magneto-optical disk (MO), or a digital versatile disc (DVD). Then, a computer can read the computer program 93 from the recording medium, and execute it.

The technologies described above are identified in the following manner, for example. One of the disclosed technologies is the estimation method. As explained with reference to FIGS. 1 to 20 and FIG. 23, the estimation method includes the following: for each different degree of degradation, performing regression analysis between the value of each feature point appearing on the differential curve of the charging-discharging curve, which indicates the voltage value V with respect to the integrated current amount Q of the reference LiB R, and at least either the capacity value or the internal resistance value of the reference LiB R (Step S4); and estimating at least either the capacity value or the internal resistance value of the target LiB 11 for estimation based on the values related to the feature points appearing on the differential curve of the target LiB 11 for estimation (Step S16).

According to the estimation method explained above, the capacity value and the internal resistance value of the target LiB 11 for estimation can be estimated based on the values related to the feature points appearing on the differential curve of the reference LiB R and based on the result of regression analysis performed between the capacity value and the internal resistance value. As long as the data of the LiB 11 is available corresponding to at least a single feature point, it is possible to perform the estimation. Thus, as one of technological improvements over conventional technologies, the capacity value and the internal resistance value of the LiB 11 can be estimated even from only a limited volume of data that is obtainable from the battery energy storage system 10 that is in operation and that includes the LiB 11.

As explained with reference to FIGS. 8 to 12, FIG. 23, and Equations (1) to (11), the result of regression analysis includes the coefficient "k" of the regression function, and the estimation can include the multiplication of the coefficient "k" with the value related to each feature point appearing on the differential curve of the target LiB 11 for estimation. For example, the capacity value and the internal resistance value of the LiB 11 can be estimated in the manner explained above.

As explained with reference to FIGS. 8 to 12 and Equations (1) to (8), the regression function can be described in terms of a linear function, and a plurality of feature points can appear on a single differential curve. In that case, the result of regression analysis includes the coefficient "k" in each of a plurality of regression functions corresponding to a plurality of feature points appearing on the differential curve of the refence LiB R; and the estimation can include the multiplication of the coefficient "k" of the regression function for which the correlation coefficient is closest to "1" (i.e., the regression function suitable for estimation), from among a plurality of regression functions, with the value of the feature point corresponding to the abovementioned regression function (i.e., the regression function suitable for regression analysis) from among a plurality of feature points appearing on the differential curve of the target LiB 11 for estimation. Alternatively, the estimation can include the multiplication of the coefficient "k" of the regression function for which the correlation coefficient is equal to or greater than a threshold value (i.e., the regression function suitable for estimation), from among a plurality of regression functions, with the value of the feature point corresponding to the abovementioned regression function (the regression function suitable for regression analysis) from among a plurality of feature points appearing on the differential curve of the target LiB 11 for estimation. As a result, using the coefficient "k" of the regression function that is suitable for estimation, the capacity value and the internal resistance value of the LiB 11 can be estimated.

As explained with reference to FIG. 21 and Equation (9), the regression function is described in terms of a plurality of linear functions, and the linear functions can include a first linear function corresponding to the section having a relatively lower degree of degradation of the reference LiB R and can include a second linear function corresponding to the section having a relatively higher degree of degradation of the reference LiB. As explained with reference to Equations (10) and (11), the regression function can be described in terms of at least either a multi-order function or a multiple regression function. Thus, even when an appropriate regression function is difficult to obtain using only a single linear function, it still becomes possible to obtain an appropriate regression function.

As explained with reference to FIG. 22, the LiB 11 represents the reference LiB R; and the estimation method can include performing regression analysis in a repeated manner as the LiB 11 goes on degradation more and can include updating the result of regression analysis (Yes at Step S21, and Step S23). As a result of using the latest result of regression analysis, it becomes possible to enhance the estimation accuracy of the capacity value and the internal resistance value of the LiB 11. Besides, there is no need to perform regression analysis using some other reference LiB R other than the LiB 11.

As explained with reference to FIGS. 4 to 6, the differential curve represents the derivative value dQ/dV obtained with respect to the voltage value V by differentiating the integrated current amount Q by the voltage value V, and the value related to a feature point can include at least either the voltage V or the derivative value dQ/dV at a peak P appearing on the differential curve. For example, using such values, the capacity value and the internal resistance value of the LiB 11 can be estimated.

The current value in the charging-discharging curve of the reference LiB R can be essentially same as the current value in the charging-discharging curve serving as the basis for the differential curve of the target LiB 11 for estimation. Thus, the impact of the fact that the charging-discharging curve is dependent on the current values can be reduced or avoided, thereby enabling achieving enhancement in the estimation accuracy.

The estimation system 1 explained with reference to FIGS. 1 to 15 is also one of the disclosed technologies. The estimation system 1 includes the regression analysis unit 6 and the estimating unit 8. The regression analysis unit 6 performs regression analysis between the value of each feature point, which appears on the differential curve of the charging-discharging curve indicating the voltage value V with respect to the integrated current amount Q of the reference LiB R, and at least either the capacity value or the internal resistance value of the reference LiB R. Based on the result of regression analysis and the values related to the feature points appearing on the differential curve of the LiB 11, the estimating unit 8 estimates at least either the capacity value or the internal resistance value of the LiB 11. Using that estimation system 1 too, as explained earlier, the capacity value and the internal resistance value of the LiB 11 can be estimated even from only a limited volume of data.

The computer program 93 explained with reference to FIGS. 15 and 23 is also one of the disclosed technologies. The computer program 93 causes a computer to perform: an operation in which, for each different degree of degradation, regression analysis is performed between the value of each feature point, which appears on the differential curve of the charging-discharging curve indicating the voltage value V with respect to the integrated current amount Q of the reference LiB R, and at least either the capacity value or the internal resistance value of the reference LiB R; and an operation in which, based the result of regression analysis and the values related to the feature points appearing on the differential curve of the LiB 11, at least either the capacity value or the internal resistance value of the LiB 11 is estimated. Using the computer program 93 too, as explained earlier, the capacity value and the internal resistance value of the LiB 11 can be estimated even from only a limited volume of data.

What is claimed is:

1. An estimation method comprising:
   performing, for each different degradation degree among a plurality of degradation degrees regression analysis between a first value and
   a second value, wherein
      the first value is related to one or more reference feature points on a differential curve of a charging-discharging curve indicating a voltage value with respect to integrated current amount of a reference storage battery, and
      the second value is at least one of a capacity value of the reference storage battery and an internal resistance value of the reference storage battery; and
   estimating at least one of a capacity value of a target storage battery and an internal resistance value of the target storage battery, based on a result of the regression analysis and a third value related to one or more target feature points on a differential curve of a charging-discharging curve indicating a voltage value with respect to integrated current amount of the target storage battery.

2. The estimation method according to claim 1, wherein
   the result of the regression analysis includes a coefficient of a regression function, and
   the estimating includes multiplying the coefficient to the third value.

3. The estimation method according to claim 2, wherein
   the regression function includes linear functions, and
   the linear functions include:
      a first linear function corresponding to a section in which the reference storage battery has a first degree of degradation, and
      a second linear function corresponding to a section in which the reference storage battery has a second degree of degradation higher than the first degree of degradation.

4. The estimation method according to claim 2, wherein the regression function includes at least one of a multi-order function and a multiple regression function.

5. The estimation method according to claim 1, wherein
   the result of the regression analysis includes a coefficient of each of regression functions corresponding to the reference feature points,
   each of the regression functions includes a linear function,
   the estimating includes multiplying the coefficient of one of the regression functions to the third value related to one of the target feature points,
   the one of the regression functions has a correlation coefficient closest to 1, and
   the one of the target feature points corresponds to the one of the regression functions.

6. The estimation method according to claim 1, wherein
   the result of the regression analysis includes a coefficient of each of regression functions corresponding to the reference feature points,
   each of the regression functions includes a linear function,
   the estimating includes multiplying the coefficient of one of the regression functions to the third value related to one of the target feature points,
   the one of the regression functions has a correlation coefficient equal to or greater than a threshold value, and
   the one of the target feature points corresponds to the one of the regression functions.

7. The estimation method according to claim 1, wherein
   the target storage battery is the reference storage battery,
   the regression analysis is repeated as the target storage battery goes on degradating more, and
   the estimation method further comprises updating the result of the regression analysis.

8. The estimation method according to claim 1, wherein
   each of the differential curve for the reference storage battery and the differential curve for the target storage battery represents a derivative value obtained with respect to a voltage value by differentiating integrated current amount by a voltage value, and
   each of the first value and the third value includes at least one of a voltage value and a derivative value at a peak on each of the differential curve for the reference storage battery and the differential curve for the target storage battery.

9. An estimation system comprising a processor that:
   performs, for each different degradation degree among a plurality of degradation degrees, regression analysis between a first value and a second value, wherein
      the first value is related to one or more reference feature points on a differential curve of a charging-discharging curve indicating a voltage value with respect to integrated current amount of a reference storage battery, and
      the second value is at least one of a capacity value of the reference storage battery and an internal resistance value of the reference storage battery; and
   estimates at least one of a capacity value of a target storage battery and an internal resistance value of the target storage battery, based on a result of the regression analysis and a third value related to one or more target feature points on a differential curve of a charging-discharging curve indicating a voltage value with respect to integrated current amount of the target storage battery.

10. A non-transitory computer-readable recording medium having stored therein estimation instructions that cause a computer to:
   perform, for each different degradation degree among a plurality of degradation degrees, regression analysis between a first value and a second value, wherein the first value is related to one or more reference feature points on a differential curve of a charging-discharging curve indicating a voltage value with respect to integrated current amount of a reference storage battery, and the second value is at least one of a capacity value of the reference storage battery and an internal resistance value of the reference storage battery; and estimate at least one of a capacity value of a target storage battery and an internal resistance value of the target storage battery, based on a result of the regression analysis and a third value related to one or more target feature points on a differential curve of a charging-discharging curve indicating a voltage value with respect to integrated current amount of the target storage battery.

* * * * *